US012615896B2

(12) United States Patent
Kang et al.

(10) Patent No.: US 12,615,896 B2
(45) Date of Patent: Apr. 28, 2026

(54) DISPLAY DEVICE AND METHOD OF MANUFACTURING THE SAME

(71) Applicant: Samsung Display Co., Ltd., Yongin-Si (KR)

(72) Inventors: Seungbae Kang, Yongin-si (KR); Sungjun Kim, Yongin-si (KR); Sunghoon Moon, Yongin-si (KR); Byoung Kwon Choo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 18/195,944

(22) Filed: May 11, 2023

(65) Prior Publication Data

US 2024/0136480 A1    Apr. 25, 2024
US 2024/0234650 A9    Jul. 11, 2024

(30) Foreign Application Priority Data

Oct. 25, 2022    (KR) ........................ 10-2022-0138042

(51) Int. Cl.
H10H 20/853    (2025.01)
H01L 25/075    (2006.01)
(Continued)

(52) U.S. Cl.
CPC ....... H10H 20/853 (2025.01); H01L 25/0753 (2013.01); H10H 20/84 (2025.01); (Continued)

(58) Field of Classification Search
CPC ............. H10K 59/8792; H10K 59/878; H10K 50/865; H10K 50/858; H10H 20/0363; H10H 20/855; H01L 25/0753
See application file for complete search history.

(56) References Cited

U.S. PATENT DOCUMENTS

| 7,151,580 B2 | 12/2006 | Ueki et al. |
| 8,213,082 B2 | 7/2012 | Gaides et al. |
| 2021/0217831 A1* | 7/2021 | Jung ................. H10K 59/8792 |

FOREIGN PATENT DOCUMENTS

| KR | 10-0472893 B1 | 3/2005 |
| KR | 10-2016-0083609 A | 7/2016 |

(Continued)

*Primary Examiner* — Antonio B Crite
(74) *Attorney, Agent, or Firm* — Innovation Counsel LLP

(57) ABSTRACT

A display device is disclosed that includes a substrate, a light emitting device disposed on the substrate, an encapsulation layer covering the light emitting device, a light control film disposed on the encapsulation layer and including a plurality of light control patterns, and each of the light control patterns includes a first metal pattern disposed on the encapsulation layer, a first light transmission pattern disposed on the first metal pattern, a second metal pattern disposed on the first light transmission pattern and overlapping the first metal pattern, a second light transmission pattern disposed on the second metal pattern and overlapping the first light transmission pattern, a first light blocking pattern disposed on the same layer as the first metal pattern and overlapping the first light transmission pattern, and a second light blocking pattern disposed on the same layer as the second metal pattern and overlapping the second light transmission pattern.

14 Claims, 15 Drawing Sheets

(51) Int. Cl.

| | | |
|---|---|---|
| *H01L 25/16* | (2023.01) | |
| *H10H 20/01* | (2025.01) | |
| *H10H 20/84* | (2025.01) | |
| *H10H 20/855* | (2025.01) | |
| *H10H 20/857* | (2025.01) | |
| *H10K 50/844* | (2023.01) | |
| *H10K 50/858* | (2023.01) | |
| *H10K 50/86* | (2023.01) | |
| *H10K 59/80* | (2023.01) | |
| *H10K 71/20* | (2023.01) | |

(52) U.S. Cl.
CPC ......... *H10H 20/857* (2025.01); *H10H 20/034* (2025.01); *H10H 20/0364* (2025.01)

(56) References Cited

FOREIGN PATENT DOCUMENTS

| | | |
|---|---|---|
| KR | 10-2018-0084333 A | 7/2018 |
| KR | 10-1967403 B1 | 4/2019 |
| KR | 10-2021-0144228 A | 11/2021 |

* cited by examiner

FIG. 3

LCP: LP, MP1, MP2, LTP1, LTP2

LCF: LCP, FP

LCP:LP,MP1,MP2,LTP1,LTP2
LCF:LCP,FP

LCP:LP,MP1,MP2,LTP1,LTP2
LCF:LCP,FP

LCP:LP,MP1,MP2,LTP1,LTP2
LCF:LCP,FP

LCP:LP,LB,MP1,MP2,LTP1,LTP2
LCF:LCP,FP

FIG. 17

DISPLAY DEVICE AND METHOD OF MANUFACTURING THE SAME

This application claims priority to Korean Patent Application No. 10-2022-0138042, filed on Oct. 25, 2022, and all the benefits accruing therefrom under 35 U.S.C. § 119, the content of which in its entirety is herein incorporated by reference.

BACKGROUND

1. Field

The present disclosure relates to a display device and method of manufacturing the display device.

2. Description of the Related Art

As information technology develops, an importance of display device, which is a communication media between users and information, is being highlighted. Accordingly, use of the display device such as a liquid crystal display device, an organic light emitting display device, a plasma display device, or the like is increasing.

SUMMARY

Embodiments may provide a display device capable of limiting a viewing angle.

Embodiments may provide a method of manufacturing the display device.

A display device according to an embodiment includes a substrate, a light emitting device disposed on the substrate, an encapsulation layer covering the light emitting device, a light control film disposed on the encapsulation layer and including a plurality of light control patterns, and each of the light control patterns includes a first metal pattern disposed on the encapsulation layer, a first light transmission pattern disposed on the first metal pattern, a second metal pattern disposed on the first light transmission pattern and overlapping the first metal pattern, a second light transmission pattern disposed on the second metal pattern and overlapping the first light transmission pattern, a first light blocking pattern disposed on a same layer as the first metal pattern and overlapping the first light transmission pattern, and a second light blocking pattern disposed on a same layer as the second metal pattern and overlapping the second light transmission pattern.

In an embodiment, the first light blocking pattern may be disposed within a first undercut shape defined by the first metal pattern and the first light transmission pattern, and the second light blocking pattern may be disposed within a second undercut shape defined by the second metal pattern and the second light transmission pattern.

In an embodiment, a refractive index of the first light transmission pattern for light in a wavelength range of about 380 nm to about 780 nm may be about 1 to about 2, and a refractive index of the second light transmission pattern for light in a wavelength range of about 380 nm to about 780 nm may be about 1 to about 2.

In an embodiment, a distance between the light control patterns adjacent to each other may be about 5 micrometers to about 10 micrometers.

In an embodiment, a height of each of the light control patterns may be about 10 micrometers to about 30 micrometers.

In an embodiment, a width of the first light blocking pattern and a width of the second light blocking pattern may be about 1 micrometers to 2 micrometers.

In an embodiment, an etching rate of the second metal pattern may be lower than an etching rate of the first metal pattern in the same etching process.

In an embodiment, the first metal pattern and the second metal pattern may include a transparent conductive oxide.

In an embodiment, the first light transmission pattern and the second light transmission pattern may include a transparent organic material.

In an embodiment, the first light blocking pattern and the second light blocking pattern may overlap each other in a plan view.

In an embodiment, the light control film may further include at least one filling pattern disposed between light control patterns adjacent to each other and including a transparent organic material.

In an embodiment, each of the light control patterns further may include a light blocking partition covering a side surface of the first light transmission pattern, a side surface of the second light transmission pattern, a side surface of the first light blocking pattern, and a side surface of the second light blocking pattern.

In an embodiment, the light blocking partition may be integrally formed with the first light blocking pattern and the second light blocking pattern.

In an embodiment, at least one of the light control patterns may have a through hole penetrating a corresponding light control pattern, and the through hole may be filled with the same material as the first light blocking pattern and the second light blocking pattern.

A method of manufacturing a display device according to an embodiment includes providing a substrate with a light emitting device formed on the substrate and an encapsulation layer covering the light emitting device, and producing a light control film including a plurality of light control patterns on the encapsulation layer, the producing the light control film includes forming the light control patterns, and the forming the light control patterns includes forming a preliminary light control layer in which a first metal layer, a first insulating layer, a second metal layer, and a second insulating layer are sequentially stacked, forming a mask pattern on the preliminary light control layer, forming a second light transmission pattern by removing a portion of the second insulating layer exposed from the mask pattern through a first etching process, forming a second metal pattern by removing a portion of the second metal layer exposed from the second light transmission pattern and a portion of the second metal layer overlapping a portion of the second light transmission pattern through a second etching process, forming a first light transmission pattern by removing a portion of the first insulating layer through the first etching process using the mask pattern as a mask, forming a first metal pattern by removing a portion of the first metal layer exposed from the first light transmission pattern and a portion of the first metal layer overlapping a portion of the first light transmission pattern through the second etching process, forming a preliminary light blocking layer covering the first metal pattern, the first light transmission pattern, the second metal pattern, and the second light transmission pattern, and forming a first light blocking pattern on a same layer as the first metal pattern and a second light blocking pattern on a same layer as the second metal pattern by removing a portion of the preliminary light blocking layer.

In an embodiment, an etching rate of the first metal layer in the first etching process may be lower than an etching rate of the first insulating layer in the first etching process, an etching rate of the second metal layer in the first etching process may be lower than an etching rate of the second insulating layer in the first etching process, an etching rate of the first metal layer in the second etching process may be higher than an etching rate of the first insulating layer in the second etching process, and an etching rate of the second metal layer in the second etching process may be higher than an etching rate of the second insulating layer in the second etching process.

In an embodiment, an etching rate of the mask pattern in the second etching process may be lower than the etching rate of the first metal layer in the second etching process and the etching rate of the second metal layer in the second etching process.

In an embodiment, the etching rate of the second metal layer in the second etching process may be lower than the etching rate of the first metal layer in the second etching process.

In an embodiment, the providing of the light control film may further include providing a filling pattern disposed between the light control patterns adjacent each other and including a transparent organic material after providing the light control patterns.

In an embodiment, in the providing the first light blocking pattern and the second light blocking pattern, a portion of the preliminary light blocking layer may be removed through an entire-surface ashing process.

Display device according to embodiments may include the light control film. In addition, the light control film may include the first light blocking patterns which extend in a first direction and are spaced apart from each other along a second direction and the second light blocking patterns which are disposed on the first light blocking patterns, extend in a first direction, and are spaced apart from each other along the second direction. That is, the light blocking patterns of the light control film may have a multi-level structure. Accordingly, even when a height of each of the light blocking patterns is not increased, the light control film suitable for controlling the viewing angle may be easily formed. Thus, efficiency of the process of manufacturing the light control film may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 3 is a cross-sectional view taken along line I-I' of FIG. 2.

FIGS. 15, 16, 17, 18, 19, and 20 are views illustrating various display devices according to embodiments.

DETAILED DESCRIPTION

Figure 1:
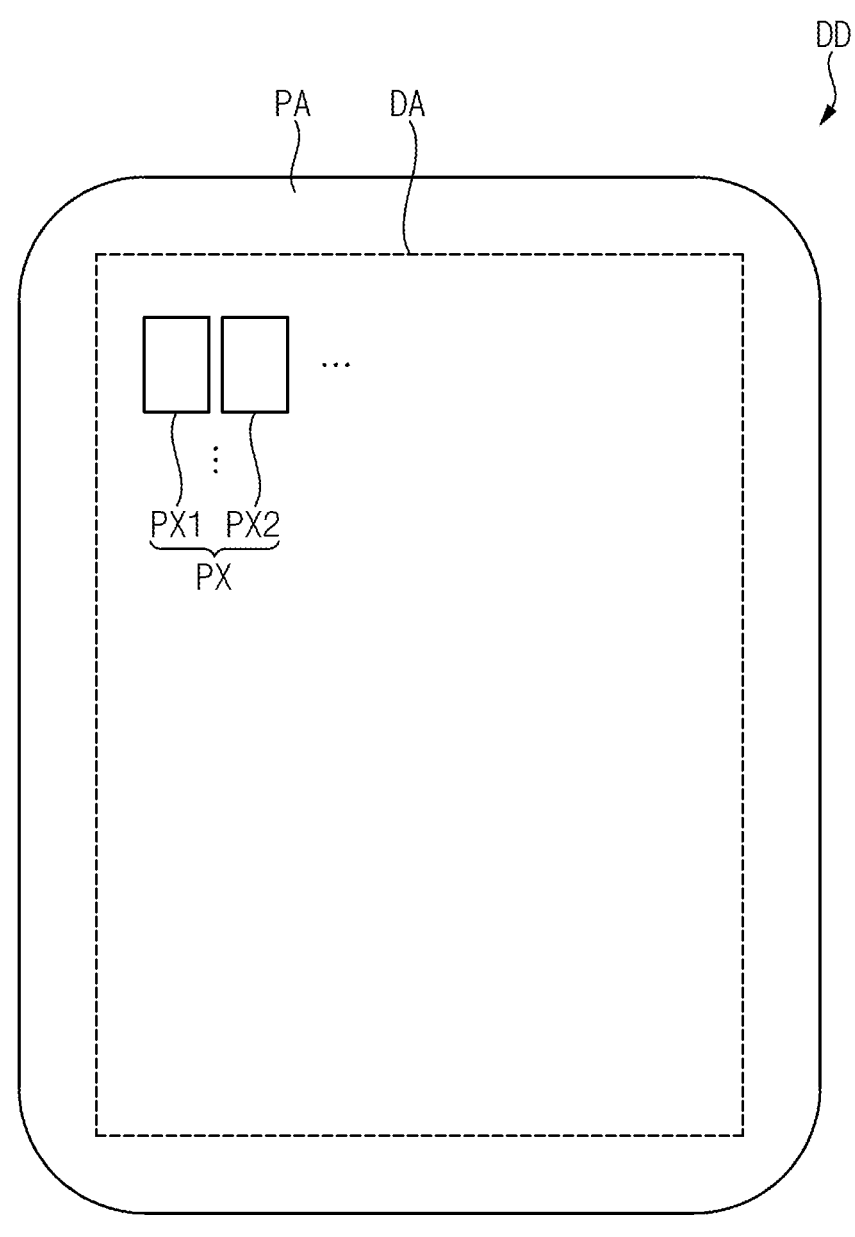
FIG. 1 is a plan view illustrating a display device according to an embodiment.
Figure 1:
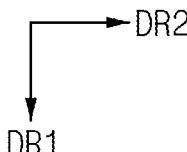

Embodiments will be described more fully hereinafter with reference to the accompanying drawings. Like reference numerals refer to like elements throughout.

FIG. 1 is a plan view illustrating a display device according to an embodiment.

Referring to FIG. 1, a display device DD according to an embodiment may include a display area DA and a peripheral area PA.

A plurality of pixels PX may be disposed in the display area DA. Each of the plurality of pixels PX may emit light. The plurality of pixels PX may include a first pixel PX1 and a second pixel PX2. In an embodiment, the first pixel PX1 and the second pixel PX2 may simultaneously emit light. In an alternative embodiment, when the first pixel PX1 emits light, the second pixel PX2 may not emit light. In an alternative embodiment, when the first pixel PX1 does not emit light, the second pixel PX2 may emit light. As each of the plurality of pixels PX emits light, the display area DA may display an image.

The plurality of pixels PX may be repeatedly arranged along a first direction DR1 and a second direction DR2 perpendicular the first direction DR1 in a plan view. For example, the second pixel PX2 may be adjacent to the first pixel PX1. Specifically, the second pixel PX2 may be adjacent to the first pixel PX1 in the second direction DR2.

The peripheral area PA may be located around the display area DA. For example, the peripheral area PA may surround at least a portion of the display area DA. A driver may be disposed in the peripheral area PA. The driver may provide signals or voltages to the plurality of pixels PX. For example, the driver may include a data driver and a gate driver. The peripheral area PA may not display an image.

In this specification, a plane may be defined as the first direction DR1 and the second direction DR2. For example, the first direction DR1 may be perpendicular to the second direction DR2.

The display device DD may include an organic light emitting display device (OLED), a liquid crystal display device (LCD), a field emission display device (FED), a plasma display device (PDP), an electrophoretic display device (EPD), or an inorganic light emitting display device (ILED).

Figure 2:
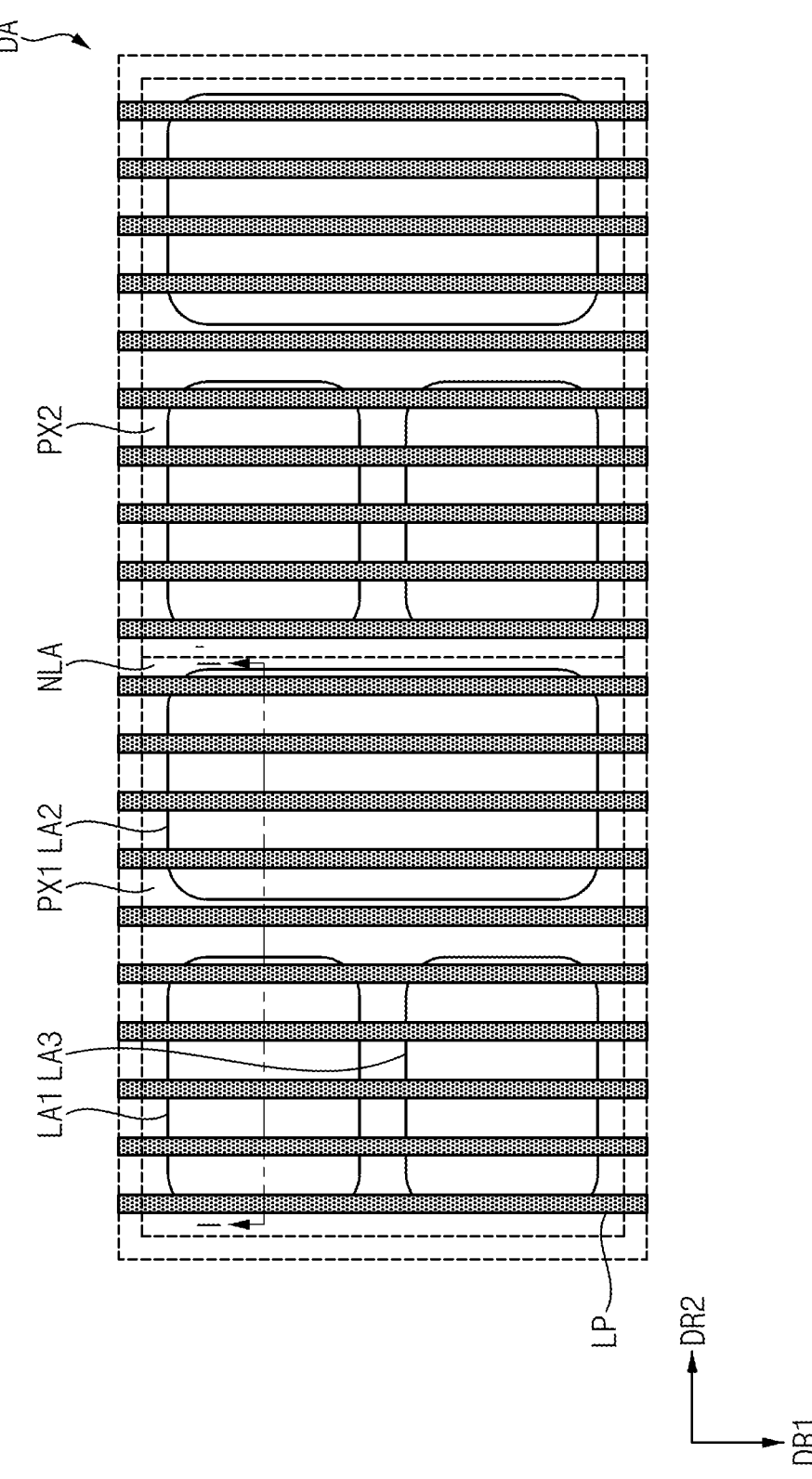
FIG. 2 is an enlarged plan view of a portion of the display area of the display device of FIG. 1.

FIG. 2 is an enlarged plan view of a portion of the display area of the display device of FIG. 1.

Referring to FIGS. 1 and 2, as described above, the display device DD may include a display area DA and a peripheral area PA, and the plurality of pixels PX may be disposed in the display area DA. The plurality of pixels PX may include the first pixel PX1 and the second pixel PX2.

Each of the first pixel PX1 and the second pixel PX2 may include a first light emitting area LA1, a second light emitting area LA2, a third light emitting area LA3, and a non-light emitting area NLA.

The first light emitting area LA1 may emit light of a first color, the second light emitting area LA2 may emit light of a second color, and the third light emitting area LA3 may emit light of a third color. In an embodiment, the first color may be a red, the second color may be a blue, and the third color may be a green. As a light of the first color, a light of the second color, and a light of the third color are mixed, each of the first pixel PX1 and the second pixel PX2 may emit light of various colors. The non-light emitting area NLA may not emit light.

In an embodiment, the display device DD may include a plurality of light blocking patterns LP. Each of the plurality of light blocking patterns LP may extend in the first direction DR1. The plurality of light blocking patterns LP may be parallel to each other. Also, some of the plurality of light blocking patterns LP may overlap the first to third light emitting areas LA1, LA2, and LA3.

Figure 3:
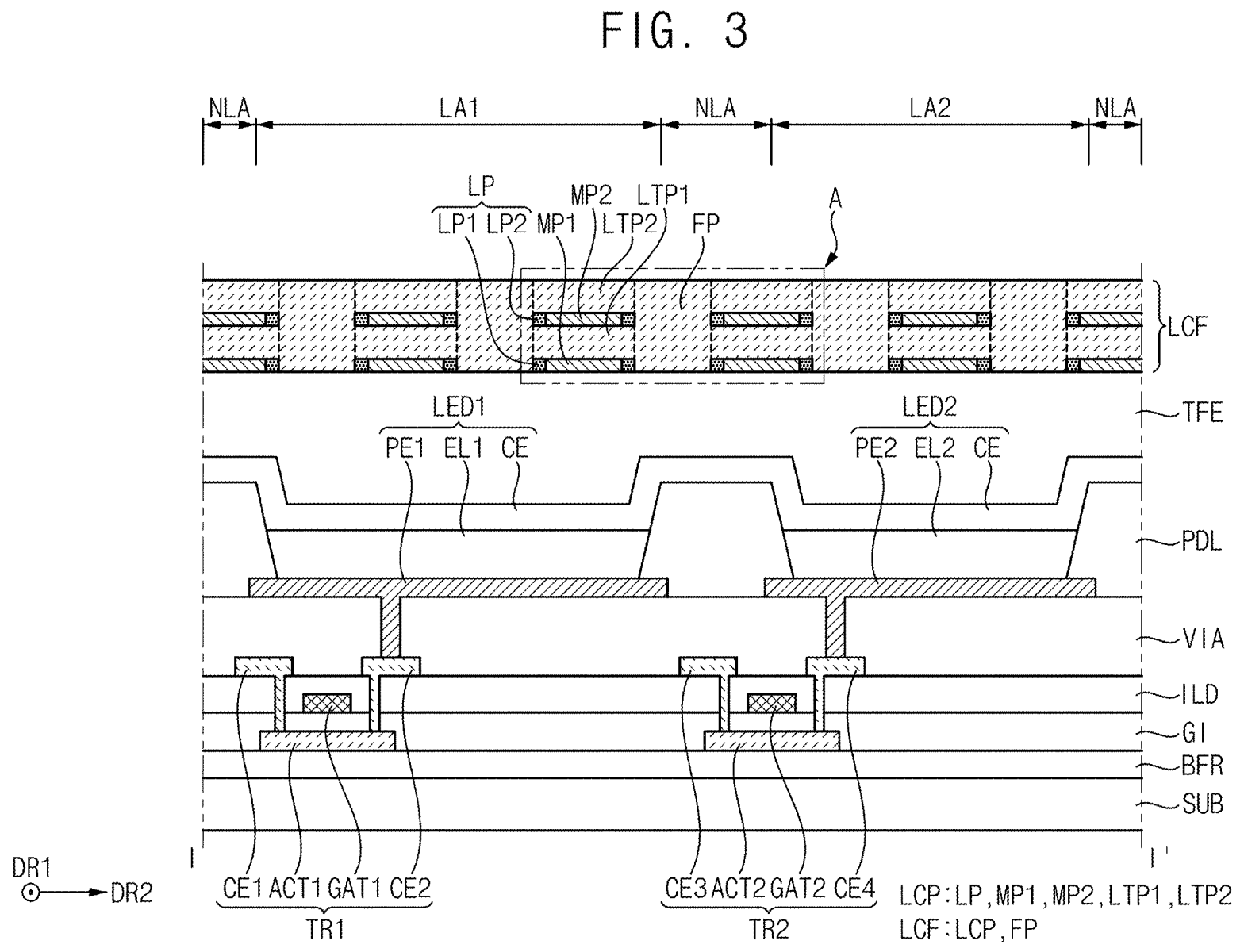
Figure 4:
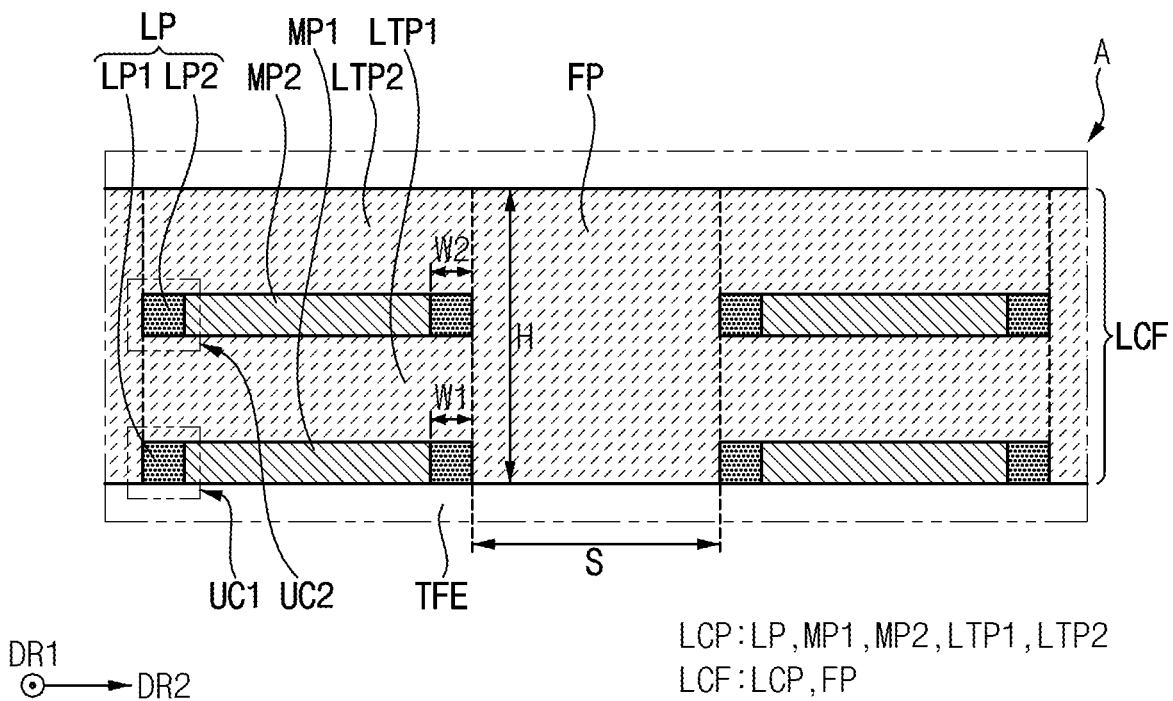
FIG. 4 is an enlarged cross-sectional view of an area 'A' of FIG. 3.

FIG. 3 is a cross-sectional view taken along line I-I' of FIG. 2. FIG. 4 is an enlarged cross-sectional view of an area 'A' of FIG. 3 according to an embodiment. Meanwhile, in FIG. 3, only cross-sectional structures of the first light emitting area LA1 and the second light emitting area LA2 are illustrated for convenience of description. A cross-sectional structure of the third light emitting area LA3 may be substantially the same as the cross-sectional structures of the first light emitting area LA1 and the second light emitting area LA2.

Referring to FIGS. 3 and 4, the display device DD may include a substrate SUB, a buffer layer BFR, a first transistor TR1, a second transistor TR2, a gate insulating layer GI, an interlayer insulating layer ILD, a via insulating layer VIA, a pixel defining layer PDL, a first light emitting device LED1, a second light emitting device LED2, an encapsulation layer TFE, and a light control film LCF.

The first transistor TR1 may include a first active pattern ACT1, a first gate electrode GAT1, a first source electrode CE1, and a first drain electrode CE2, and a second transistor TR2 may include a second active pattern ACT2, a second gate electrode GAT2, a second source electrode CE3, and a second drain electrode CE4.

In addition, the first light emitting device LED1 may include a first pixel electrode PE1, a first emission layer EL1, and a common electrode CE, and the second light emitting device LED2 may include a second pixel electrode PE2, a second emission layer EL2, and a common electrode CE.

In addition, the light control film LCF may include a plurality of light control patterns LCP and at least one filling pattern FP. In addition, each of the light control patterns LCP may include a first metal pattern MP1, a first light transmission pattern LTP1, a second metal pattern MP2, a second light transmission pattern LTP2, a first light blocking pattern LP1, and a second light blocking pattern LP2. The first light blocking pattern LP1 and the second light blocking pattern LP2 form a light blocking pattern LP. The light control patterns LCP may be arranged spaced apart from each other along the second direction DR2. The filling pattern FP may be disposed between the light control patterns LCP adjacent to each other.

The substrate SUB may include a transparent material or an opaque material. The substrate SUB may be formed of a transparent resin substrate. Examples of the transparent resin substrate may include a polyimide substrate, or the like. In this case, the polyimide substrate may include a first organic layer, a first barrier layer, a second organic layer, or the like. Optionally, the substrate SUB may include a quartz substrate, a synthetic quartz substrate, a calcium fluoride substrate, an F-doped quartz substrate, a soda lime glass substrate, a non-alkali glass substrate, or the like. These may be used alone or in combination with each other.

The buffer layer BFR may be disposed on the substrate SUB. The buffer layer BFR may prevent diffusion of metal atoms or impurities from the substrate SUB into the first transistor TR1 and the second transistor TR2. In addition, the buffer layer BFR may improve flatness of a surface of the substrate SUB when the surface of the substrate SUB is not uniform. For example, the buffer layer BFR may include an inorganic material such as silicon oxide, silicon nitride, or silicon oxynitride. These may be used alone or in combination with each other.

The first active pattern ACT1 and the second active pattern ACT2 may be disposed on the buffer layer BFR. Each of the first active pattern ACT1 and the second active pattern ACT2 may include a metal oxide semiconductor, an inorganic semiconductor (e.g., amorphous silicon, poly silicon), or an organic semiconductor. Each of the first active pattern ACT1 and the second active pattern ACT2 may include a source area, a drain area, and a channel area located between the source area and the drain area. The first active pattern ACT1 and the second active pattern ACT2 may be formed through the same process and may include the same material.

The gate insulating layer GI may be disposed on the buffer layer BFR. In an embodiment, The gate insulating layer GI may sufficiently cover the first active pattern ACT1 and the second active pattern ACT2 and may not create a step around the first active pattern ACT1 and the second active pattern ACT2 and may have a substantially flat upper surface. In an alternative embodiment, the gate insulating layer GI may cover the first active pattern ACT1 and the second active pattern ACT2 having a uniform thickness and may be arranged along the profile of the first active pattern ACT1 and the second active pattern ACT2. For example, the gate insulating layer GI may include an inorganic material such as silicon oxide, silicon nitride, silicon carbide, silicon oxynitride, or silicon oxycarbide. These may be used alone or in combination with each other.

The first gate electrode GAT1 and the second gate electrode GAT2 may be disposed on the gate insulating layer GI. The first gate electrode GAT1 may overlap the channel area of the first active pattern ACT1, and the second gate electrode GAT2 may overlap the channel area of the second active pattern ACT2.

Each of the first gate electrode GAT1 and the second gate electrode GAT2 may include a metal, an alloy, a metal nitride, a conductive metal oxide, a transparent conductive material, or the like. Examples of metals of the first gate electrode GAT1 and the second gate electrode GAT2 may include silver (Ag), molybdenum (Mo), aluminum (Al), tungsten (W), and copper (Cu), nickel (Ni), chromium (Cr), titanium (Ti), tantalum (Ta), platinum (Pt), scandium (Sc), or the like. Examples of the conductive metal oxide of the first gate electrode GAT1 and the second gate electrode GAT2 may include indium tin oxide, indium zinc oxide, or the like. Also, examples of the metal nitride of the first gate electrode GAT1 and the second gate electrode GAT2 may include aluminum nitride (AlNx), tungsten nitride (WNx), chromium nitride (CrNx), or the like. These may be used individually or in combination with each other.

The first gate electrode GAT1 and the second gate electrode GAT2 may be formed through the same process and may include the same material.

The interlayer insulating layer ILD may be disposed on the gate insulating layer GI. In an embodiment, The interlayer insulating layer ILD may sufficiently cover the first gate electrode GAT1 and the second gate electrode GAT2 and may not create a step around the first gate electrode GAT1 and the second gate electrode GAT2 and may have a substantially flat upper surface. In an alternative embodiment, the interlayer insulating layer ILD may cover the first gate electrode GAT1 and the second gate electrode GAT2 having a uniform thickness and may be arranged along the profile of the first gate electrode GAT1 and the second gate electrode GAT2. For example, the interlayer insulating layer ILD may include an inorganic material such as silicon oxide, silicon nitride, silicon carbide, silicon oxynitride, or silicon oxycarbide. These may be used alone or in combination with each other.

The first source electrode CE1, the second source electrode CE3, the first drain electrode CE2, and the second drain electrode CE4 may be disposed on the interlayer insulating layer ILD. The first source electrode CE1 may be connected to the source area of the first active pattern ACT1 through a contact hole penetrating the gate insulating layer GI and the interlayer insulating layer ILD. The second source electrode CE3 may be connected to the source area of the second active pattern ACT2 through a contact hole penetrating the gate insulating layer GI and the interlayer insulating layer ILD. The first drain electrode CE2 may be connected to the drain area of the first active pattern ACT1 through a contact hole penetrating the gate insulating layer GI and the interlayer insulating layer ILD. The second drain electrode CE4 may be connected to the drain area of the second active pattern ACT2 through a contact hole penetrating the gate insulating layer GI and the interlayer insulating layer ILD.

For example, each of the first source electrode CE1, the second source electrode CE3, the first drain electrode CE2, and the second drain electrode CE4 may include a metal, an alloy, a metal nitride, a conductive metal oxide, or a transparent material. These may be used alone or in combination with each other. The first source electrode CE1, the second source electrode CE3, the first drain electrode CE2, and the second drain electrode CE4 may be formed through the same process and may include the same material.

Accordingly, the first transistor TR1 including the first active pattern ACT1, the first gate electrode GAT1, the first source electrode CE1, and the first drain electrode CE2 may be disposed on the substrate SUB. The second transistor TR2 including the second active pattern ACT2, the second gate electrode GAT2, the second source electrode CE3, and the second drain electrode CE4 may be disposed on the substrate SUB.

The via insulating layer VIA may be disposed on the interlayer insulating layer ILD. The via insulating layer VIA may sufficiently cover the first source electrode CE1, the second source electrode CE3, the first drain electrode CE2, and the second drain electrode CE4. The via insulating layer VIA may include an organic material. For example, examples of organic materials of the via insulating layer VIA may include phenolic resin, polyacrylates resin, polyimides rein, polyamides resin, an epoxy resin, or the like. These may be used alone or in combination with each other.

The first pixel electrode PE1 and the second pixel electrode PE2 may be disposed on the via insulating layer VIA. The first pixel electrode PE1 may overlap the first light emitting area LA1, and the second pixel electrode PE2 may overlap the second light emitting area LA2. The first pixel electrode PE1 may be connected to the first drain electrode CE2 through a contact hole penetrating the via insulating layer VIA, and the second pixel electrode PE2 may be connected to the second drain electrode CE4 through a contact penetrating the via insulating layer VIA.

For example, each of the first pixel electrode PE1 and the second pixel electrode PE2 may include a metal, an alloy, a metal nitride, a conductive metal oxide, a transparent conductive material, or the like. These may be used alone or in combination with each other. In an embodiment, each of the first pixel electrode PE1 and the second pixel electrode PE2 may have a stacked structure including ITO/Ag/ITO. The first pixel electrode PE1 and the second pixel electrode PE2 may be formed through the same process and may include the same material. For example, each of the first pixel electrode PE1 and the second pixel electrode PE2 may function as an anode.

The pixel defining layer PDL may be disposed on the via insulating layer VIA. The pixel defining layer PDL may overlap the non-light emitting area NLA. The pixel defining layer PDL may cover both sides of each of the first pixel electrode PE1 and the second pixel electrode PE2. Also, a pixel opening may be defined in the pixel defining layer PDL to expose a portion of an upper surface of the first pixel electrode PE1 and a portion of an upper surface of the second pixel electrode PE2. For example, the pixel defining layer PDL may include an inorganic material or an organic material. In an embodiment, the pixel defining layer PDL may include an organic material such as an epoxy resin or a siloxane resin. These may be used alone or in combination with each other. In an alternative embodiment, the pixel defining layer PDL may further include a light blocking material containing a black pigment or a black dye.

The first emission layer EL1 may be disposed on the first pixel electrode PE1 and the second emission layer may be disposed on the second pixel electrode PE2. Each of the first emission layer EL1 and the second emission layer EL2 may include an organic material emitting light of a predetermined color. For example, the first emission layer EL1 may include an organic material emitting red light, and the second emission layer EL2 may include an organic material emitting blue light.

The common electrode CE may be disposed on the first emission layer EL1, the second emission layer EL2, and the pixel defining layer PDL. The common electrode CE may include a metal, an alloy, a metal nitride, a conductive metal oxide, a transparent conductive material, or the like. These may be used alone or in combination with each other. For example, the common electrode CE may function as a cathode.

Accordingly, the first light emitting device LED1 including the first pixel electrode PE1, the first emission layer EL1, and the common electrode CE may be disposed in the first light emitting area LA1 on the substrate SUB, the second light emitting device LED2 including the second pixel electrode PE2, the second emission layer EL2, and the common electrode CE may be disposed in the second light emitting area LA2 on the substrate SUB.

The encapsulation layer TFE may be disposed on the common electrode CE. The encapsulation layer TFE may prevent impurities, moisture, air, or the like from permeating the first light emitting device LED1 and the second light emitting device LED2 from the outside. The encapsulation layer TFE may include at least one inorganic encapsulation layer and at least one organic encapsulation layer. For example, the inorganic encapsulation layer may include silicon oxide, silicon nitride, or silicon oxynitride. These may be used alone or in combination with each other. The organic encapsulation layer may include a polymer cured material such as polyacrylate.

The light control film LCF may be disposed on the encapsulation layer TFE. The light control film LCF may include the plurality of light control patterns LCP and the filling pattern FP.

The light control patterns LCP may be arranged spaced apart from each other along the second direction DR2. The light control patterns LCP may have the same cross-sectional structure. In an embodiment, each of the light control patterns LCP may include the first metal pattern MP1, the first light transmission pattern LTP1, the second metal pattern MP2, the second light transmission pattern LTP2, the first light blocking pattern LP1, and the second light blocking pattern LP2.

The first metal pattern MP1 may be disposed on the encapsulation layer TFE. Light emitted from the first light emitting device LED1 and the second light emitting device LED2 may penetrate the first metal pattern MP1. In an embodiment, the first metal pattern MP1 may include transparent conductive oxide (TCO). Examples of the transparent conductive oxide (TCO) of the first metal pattern MP1 may include indium tin oxide (ITO), indium zinc oxide (IZO), zinc oxide (ZnO), indium oxide (In2O3), indium gallium oxide (IGO), aluminum zinc oxide (AZO), or the like. These may be used alone or in combination with each other. Preferably, the first metal pattern MP1 may include indium tin oxide (ITO) or indium zinc oxide (IZO).

The first light transmission pattern LTP1 may be disposed on the first metal pattern MP1. Light emitted from the first light emitting device LED1 and the second light emitting device LED2 may penetrate the first light transmission pattern LTP1. In an embodiment, the first light transmission pattern LTP1 may include a transparent organic material. Examples of a transparent organic material of the first light transmission pattern LTP1 may include epoxy resin, siloxane resin, polyimide resin, photoresist, or the like. These may be used alone or in combination with each other. In an embodiment, a refractive index of the first light transmission pattern LTP1 for light in a wavelength range of about 380 nm to about 780 nm may be about 1 to about 2. More specifically, the refractive index of the first light transmission pattern LTP1 may be about 1.3 to about 1.7.

In an embodiment, the first light transmission pattern LTP1 may partially overlap the first metal pattern MP1. For example, the first light transmission pattern LTP1 may have a central portion overlapping the first metal pattern MP1 and both side portions not overlapping the first metal pattern MP1. Accordingly, the first light transmission pattern LTP1 may have an undercut shape with respect to both ends of the first metal pattern MP1. That is, the first metal pattern MP1 and the first light transmission pattern LTP1 may define a pair of first undercut shapes UC1.

The second metal pattern MP2 may be disposed on the encapsulation layer TFE. Light emitted from the first light emitting device LED1 and the second light emitting device LED2 may penetrate the second metal pattern MP2. In an embodiment, the second metal pattern MP2 may include transparent conductive oxide (TCO). Examples of the transparent conductive oxide (TCO) of the second metal pattern MP2 may include indium tin oxide (ITO), indium zinc oxide (IZO), zinc oxide (ZnO), indium oxide (In2O3), indium gallium oxide (IGO), aluminum zinc oxide (AZO), or the like. These may be used alone or in combination with each other. Preferably, the second metal pattern MP2 may include indium tin oxide (ITO) or indium zinc oxide (IZO).

In an embodiment, the first metal pattern MP1 and the second metal pattern MP2 may include the same material. For example, both the first metal pattern MP1 and the second metal pattern MP2 may include indium zinc oxide (IZO) or indium tin oxide (ITO). However, the present invention is not necessarily limited thereto. For example, in an alternative embodiment, the first metal pattern MP1 and the second metal pattern MP2 may include different material each other. This will be described later in detail with reference to FIG. 18.

The second light transmission pattern LTP2 may be disposed on the second metal pattern MP2. Light emitted from the first light emitting device LED1 and the second light emitting device LED2 may penetrate the second light transmission pattern LTP2. In an embodiment, the second light transmission pattern LTP2 may include a transparent organic material. Examples of a transparent organic material of the second light transmission pattern LTP2 may include epoxy resin, siloxane resin, polyimide resin, photoresist, or the like. These may be used alone or in combination with each other. In an embodiment, a refractive index of the second light transmission pattern LTP2 for light in a wavelength range of about 380 nm to about 780 nm may be about 1 to about 2. More specifically, the refractive index of the second light transmission pattern LTP2 may be about 1.3 to about 1.7.

In an embodiment, the second light transmission pattern LTP2 may partially overlap the second metal pattern MP2. For example, the second light transmission pattern LTP2 may have a central portion overlapping the second metal pattern MP2 and both side portions not overlapping the second metal pattern MP2.

Accordingly, the second light transmission pattern LTP2 may have an undercut shape with respect to both ends of the second metal pattern MP2. That is, the second metal pattern MP2 and the second light transmission pattern LTP2 may define a pair of second undercut shapes UC2.

In an embodiment, as shown in FIGS. 5 to 9, in a manufacturing process of the display device DD, the first light transmission pattern LTP1 may be formed by removing a portion of the a first insulating layer (e.g., IL1 of FIG. 8) and the second light transmission pattern LTP2 may be formed by removing a portion of the second insulating layer (e.g., IL2 of FIG. 6) through a first etching process (e.g., a dry etching process using plasma). In addition, the first metal pattern MP1 may be formed by removing a portion of the first metal layer (e.g., ML1 of FIG. 9) and the second metal pattern MP2 may be formed by removing a portion of a second metal layer (e.g., ML2 of FIG. 7) through a second etching process (e.g., a wet etching process using an etchant).

In an embodiment, an etching rate of the first metal layer ML1 in the first etching process may be lower than an etching rate of the first insulating layer IL1 in the first etching process. Also, an etching rate of the second metal layer ML2 in the first etching process may be lower than an etching rate of the second insulating layer IL2 in the first etching process.

In other words, an etching rate of the first metal pattern MP1 in the first etching process may be lower than an etching rate of the first light transmission pattern LTP1 in the first etching process, and an etching rate of the second metal pattern MP2 in the first etching process may be lower than an etching rate of the second light transmission pattern LTP2 in the first etching process.

That is, according to the first etching process, the first insulating layer IL1 may be etched relatively more than the first metal layer ML1, and the second insulating layer IL2 may be etched relatively more than the second metal layer ML2. For example, according to the first etching process, only the first insulating layer IL1 may be etched, and the first metal layer ML1 may not be etched. Also, according to the first etching process, only the second insulating layer IL2 may be etched, and the second metal layer ML2 may not be etched.

In an embodiment, an etching rate of the first metal layer ML1 in the second etching process may be higher than an etching rate of the first insulating layer IL1 in the second etching process. Also, an etching rate of the second metal layer ML2 in the second etching process may be higher than an etching rate of the second insulating layer IL2 in the second etching process.

In other words, an etching rate of the first metal pattern MP1 in the second etching process is higher than an etching rate of the first light transmission pattern LTP1 in the second etching process, and an etching rate of the second metal pattern MP2 in the second etching process is higher than an etching rate of the second light transmission pattern LTP2 in the second etching process.

That is, according to the second etching process, the first metal layer ML1 may be etched relatively more than the first insulating layer Ill, and the second metal layer ML2 may be etched relatively more than the second insulating layer IL2. For example, according to the second etching process, only the first metal layer ML1 may be etched, and the first insulating layer IL1 may not be etched. Also, according to the second etching process, only the second metal layer ML2 may be etched, and the second insulating layer IL2 may not be etched.

Accordingly, by repeatedly performing the first etching process and the second etching process are performed on a laminate in which the first metal layer ML1, the first insulating layer IL1, the second metal layer ML2, and the second insulating layer IL2 are sequentially stacked, the first metal pattern MP1 and the first light transmission pattern LTP1 defining the pair of first undercut shapes UC1 and the pair of second undercut shapes UC2 may be formed. This will be described later in more detail with reference to FIGS. 5 to 9.

Referring to FIGS. 3 and 4, the first light blocking pattern LP1 may be disposed on the same layer as the first metal pattern MP1. For example, the first light blocking pattern LP1 may be disposed on the encapsulation layer TFE. In an embodiment, the first light blocking pattern LP1 may overlap the first light transmission pattern LTP1. For example, the first light blocking pattern LP1 may overlap a portion of the first light transmission pattern LTP1 which does not overlap the first metal pattern MP1. In other words, the first light blocking pattern LP1 may be disposed within the first undercut shape UC1 defined by the first metal pattern MP1 and the first light transmission pattern LTP1. That is, each of the light control patterns LCP may include the pair of first light blocking patterns LP1. Each of the pair of first light blocking patterns LP1 may extend along the first direction DR1 and may be spaced apart from each other in the second direction DR2.

In an embodiment, the first light blocking pattern LP1 may include molybdenum (Mo), aluminum (Al), titanium (Ti), tungsten (W), silver (Ag), copper (Cu), gold (Au), a black pigment, a black dye, and a molybdenum-tantalum oxide, or the like. Among the lights emitted from the first light emitting device LED1 and the second light emitting device LED2, light incident on the first light blocking pattern LP1 may be reflected from the first light blocking pattern LP1, may be transmitted through the first light blocking pattern LP1, or may be absorbed by the first light blocking pattern LP1. In an embodiment, most of the light incident on the first light blocking pattern LP1 may be absorbed by the first light blocking pattern LP1. Accordingly, the first light blocking pattern LP1 may control the viewing angle of the display device DD.

In an embodiment, a width W1 of the first light blocking pattern LP1 in the second direction DR2 may be about 1 micrometers to about 2 micrometers, more specifically, about 1.5 micrometers to about 2 micrometers. When the width W1 of the first light blocking pattern LP1 satisfies the above range, the viewing angle control effect through the first light blocking pattern LP1 may be further improved.

The second light blocking pattern LP2 may be disposed on the same layer as the second metal pattern MP2. For example, the second light blocking pattern LP2 may be disposed on the first light transmission pattern LTP2. In an embodiment, the second light blocking pattern LP2 may overlap the second light transmission pattern LTP2. For example, the second light blocking pattern LP2 may overlap a portion of the second light transmission pattern LTP2 which does not overlap the second metal pattern MP2. In other words, the second light blocking pattern LP2 may be disposed within the second undercut shape UC2 defined by the second metal pattern MP2 and the second light transmission pattern LTP2. That is, each of the light control patterns LCP may include the pair of second light blocking patterns LP2. Each of the pair of second light blocking patterns LP2 may extend along the first direction DR1 and may be spaced apart from each other in the second direction DR2. In an embodiment, the second light blocking pattern LP2 may overlap the first light blocking pattern LP1 in a plan view.

In an embodiment, the second light blocking pattern LP2 may include molybdenum (Mo), aluminum (Al), titanium (Ti), tungsten (W), silver (Ag), copper (Cu), gold (Au), a black pigment, a black dye, and a molybdenum-tantalum oxide, or the like. Among the lights emitted from the first light emitting device LED1 and the second light emitting device LED2, light incident on the second light blocking pattern LP2 may be reflected from the second light blocking pattern LP2, may be transmitted through the second light blocking pattern LP2, or may be absorbed by the second light blocking pattern LP2. In an embodiment, most of the light incident on the second light blocking pattern LP2 may be absorbed by the second light blocking pattern LP2. Accordingly, the second light blocking pattern LP2 may control the viewing angle of the display device DD.

In an embodiment, a width W2 of the second light blocking pattern LP2 in the second direction DR2 may be about 1 micrometers to about 2 micrometers, more specifically, about 1.5 micrometers to about 2 micrometers. When the width W2 of the second light blocking pattern LP2 satisfies the above range, the viewing angle control effect through the second light blocking pattern LP2 may be further improved.

In an embodiment, a distance S between the light control patterns LCP adjacent to each other may be about 5 micrometers to about 10 micrometers, more specifically, about 6 micrometers to about 8 micrometers. In an embodiment, a height H of each of the light control patterns LCP may be about 10 micrometers to about 30 micrometers, more specifically, about 15 micrometers to about 30 micrometers. When the light control patterns LCP satisfy the above ranges, a viewing angle control effect through the light control patterns LCP may be further improved.

The filling pattern FP may be disposed on the encapsulation layer TFE and may be disposed between the light control patterns LCP adjacent to each other. In an embodiment, a height of an upper surface of the filling pattern FP may be substantially the same as a height of an upper surface of the light control patterns LCP. Accordingly, the light control film LCF may have a substantially flat upper surface.

Light emitted from the first light emitting device LED1 and the second light emitting device LED2 may transmit the filling pattern FP. In an embodiment, the filling pattern FP may include a transparent organic material. Examples of a transparent organic material of the filling pattern FP may include epoxy resin, siloxane resin, polyimide resin, photoresist, or the like. These may be used alone or in combination with each other. In an embodiment, the filling pattern FP may include the same material as the first light transmission pattern LTP1 and the second light transmission pattern LTP2.

Meanwhile, although FIGS. 3 and 4 illustrates that each of the light control patterns LCP includes two metal patterns MP1 and MP2 and two light transmission patterns LTP1 and LTP2, and accordingly, the light blocking patterns of the light control film LCF has a two-level structure, the present invention is not necessarily limited thereto. In an alternative embodiment, each of the light control patterns LCP may include three or more metal patterns and three or more light transmission patterns. In this case, the light blocking patterns of the light control film LCF may have a multi-level structure of three or more levels.

According to embodiments, the light control film LCF may include the first light blocking patterns LP1 which extend in a first direction DR1 and are spaced apart from each other along a second direction DR2 and the second light blocking patterns LP2 which are disposed on the first light blocking patterns LP1, extend in a first direction DR1, and are spaced apart from each other along the second direction DR2. That is, the light blocking patterns of the light control film LCF may have a multi-level structure. Accordingly, even when a height of each of the light blocking patterns is not increased, the light control film LCF suitable for controlling the viewing angle may be easily formed. Thus, efficiency of the process of manufacturing the light control film LCF may be improved.

FIGS. 5 to 14 are cross-sectional views illustrating a method of manufacturing a display device according to an embodiment. Specifically, FIGS. 5 to 14 are cross-sectional views illustrating a method of manufacturing the light control film LCF included in the display device DD of FIG. 3 according to an embodiment.

Referring to FIG. 3, the buffer layer BFR, the first and second active patterns ACT1 and ACT2, the gate insulating layer GI, the first and second gate electrodes GAT1 and GAT2, the interlayer insulating layer ILD, the first and second source electrodes CE1 and CE3, the first and second drain electrodes CE2 and CE4, the via insulating layer VIA, the first and second pixel electrodes PE1 and PE2, the pixel defining layer PDL, the first and second light emission layers EL1 and EL2, the common electrode CE, and the encapsulation layer TFE may be sequentially formed on the substrate SUB.

That is, the first and second light emitting devices LED1 and LED2, and the encapsulation layer TFE covering the first and second light emitting devices LED1 and LED2 may be formed on the substrate SUB.

Thereafter, the light control film LCF may be formed on the encapsulation layer TFE. In an embodiment, the light control film LCF may be formed on a separate carrier film by performing a process of FIGS. 5 to 14 described below. In this case, the light control film LCF may be bonded with the encapsulation layer TFE through a separate adhesive material, or the like. However, the present invention is not necessarily limited thereto, and in an alternative embodiment, the light control film LCF may be formed directly on the encapsulation layer TFE by performing the process of FIGS. 5 to 14 described below.

Hereinafter, the process of forming the light control film LCF will be described in detail with reference to FIGS. 5 to 14.

Figure 5:
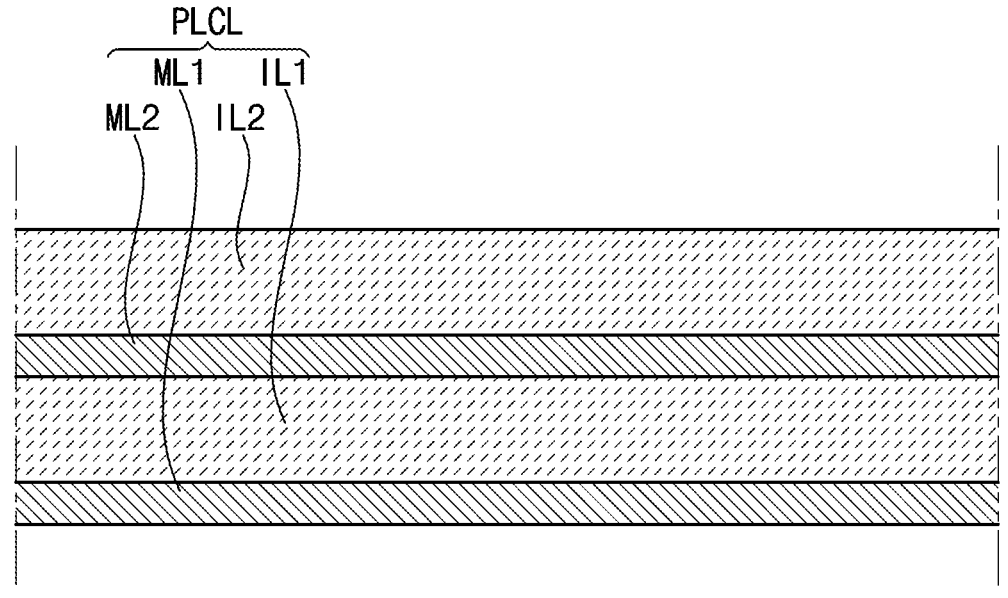
FIGS. 5, 6, 7, 8, 9, 10, 11, 12, 13, and 14 are cross-sectional views illustrating a method of manufacturing a display device according to an embodiment.

Referring to FIG. 5, a preliminary light control layer PLCL in which the first metal layer ML1, the first insulating layer IL1, the second metal layer ML2, and the second insulating layer IL2 are sequentially stacked may be formed. For example, in the case of an embodiment in which the light control film LCF is formed on the carrier film and then bonded to the encapsulation layer TFE, the preliminary light control layer PLCL may be formed on the carrier film. Optionally, in the case of an embodiment in which the light control film LCF is directly formed on the encapsulation layer TFE, the preliminary light control layer PLCL may be formed on the encapsulation layer TFE.

In an embodiment, the first metal layer ML1 may be formed by using a material having an etching rate lower than an etching rate of the first insulating layer IL1 in the first etching process (e.g., a dry etching process using plasma). Also, the second metal layer ML2 may be formed using a material having an etching rate lower than an etching rate of the second insulating layer IL2 in the first etching process.

Figure 6:
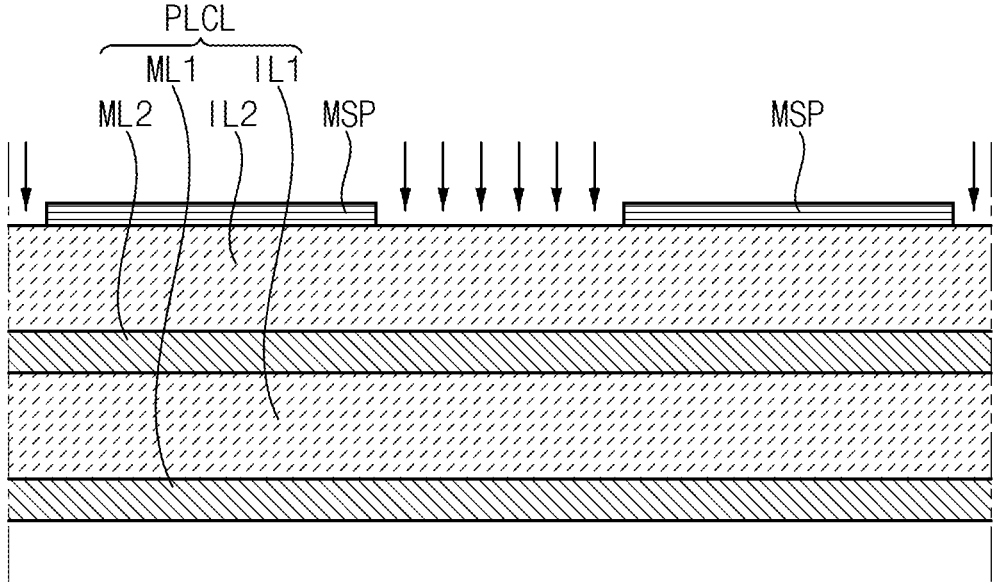

That is, in the first etching process shown in FIG. 6, the second insulating layer IL2 may be etched relatively more than the second metal layer ML2. For example, the second insulating layer IL2 may be etched in the first etching process shown in FIG. 6, but the second metal layer ML2 may not be etched. Also, in the first etching process shown in FIG. 8, the first insulating layer IL1 may be etched relatively more than the first metal layer ML1. For example, the first insulating layer IL1 may be etched in the first etching process shown in FIG. 8, but the first metal layer ML1 may not be etched.

On the other hand, the first metal layer ML1 may be formed using a material having an etching rate higher than an etching rate of the first insulating layer IL1 in the second etching process (e.g., a wet etching process using an etchant). Also, the second metal layer ML2 may be formed using a material having an etching rate higher than an etching rate of the second insulating layer IL2 in the second etching process.

Figure 7:
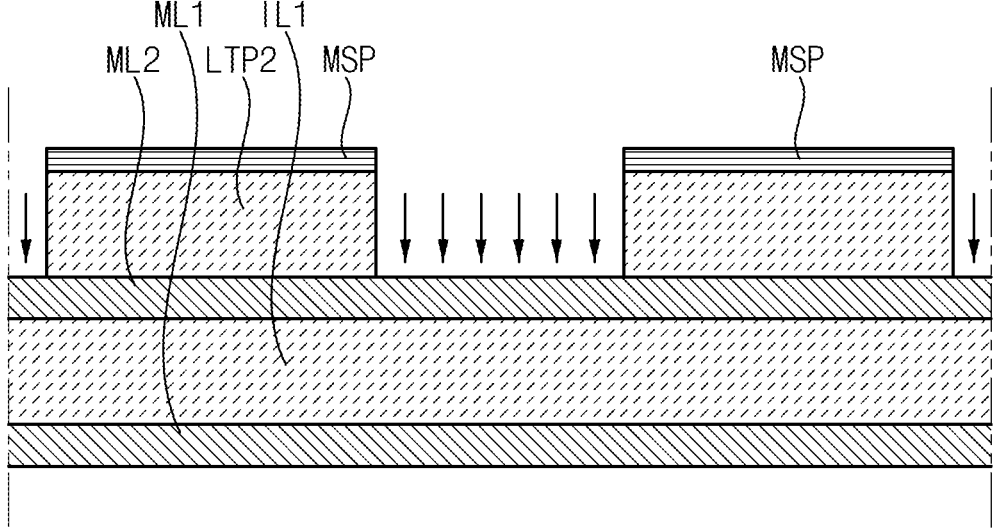

That is, in the second etching process shown in FIG. 7, the second metal layer ML2 may be etched relatively more than the second light transmission pattern LTP2 formed from the second insulating layer IL2. For example, the second metal layer ML2 may be etched in the second etching process shown in FIG. 7, but the second light transmission pattern LTP2 may not be etched. Also, in the second etching process shown in FIG. 9, the first metal layer ML1 may be etched relatively more than the first light transmission pattern LTP1 formed from the first insulating layer IL 1. For example, the first metal layer ML1 may be etched in the second etching process illustrated in FIG. 9, but the first light transmission pattern LTP1 may not be etched.

In an embodiment, each of the first metal layer ML1 and the second metal layer ML2 may be formed of a transparent conductive oxide such as tin oxide (ITO), indium zinc oxide (IZO), or zinc oxide (ZnO), Indium Oxide (In2O3), Indium Gallium Oxide (IGO), or Aluminum Zinc Oxide (AZO).

In an embodiment, each of the first insulating layer IL1 and the second insulating layer IL2 may be formed of phenolic resin, polyacrylates resin, polyimide resin, polyamide resin, siloxane resin, epoxy resin, or the like.

Referring to FIG. 6, a mask pattern MSP may be formed on the preliminary light control layer PLCL. That is, the mask pattern MSP may be formed on the second insulating layer IL2. The mask pattern MSP may expose a portion of the preliminary light control layer PCLC. That is, the mask pattern MSP may expose a portion of the second insulating layer IL2.

In an embodiment, the mask pattern MSP may be formed by using a material having an etching rate lower than an etching rate of each of the first and second metal layers ML1 and ML2 in the second etching process (e.g., a wet etching process using an etchant). For example, the second metal layer ML2 may be etched in the second etching process shown in FIG. 7, the mask pattern MSP may not be etched. Also, the first metal layer ML1 may be etched in the second etching process shown in FIG. 9, but the mask pattern MSP may not be etched.

In an embodiment, the mask pattern MSP may include a metal material or an inorganic insulating material. Examples of a metal material of the mask pattern MSP may include aluminum (Al), molybdenum (Mo), an alloy containing aluminum, an alloy containing molybdenum, or the like. These may be used alone or in combination with each other.

Referring further to FIG. 7, the second light transmission pattern LTP2 may be formed by removing a portion of the second insulating layer IL2 exposed from the mask pattern MSP through the first etching process. That is, the portion of the second insulating layer IL2 which does not overlap the mask pattern MSP may be removed, and a portion overlapping the mask pattern MSP may remain to form the second light transmission pattern LTP2. As described above, in an embodiment, the second metal layer ML2 may not be etched while the second insulating layer IL2 is etched.

Figure 8:
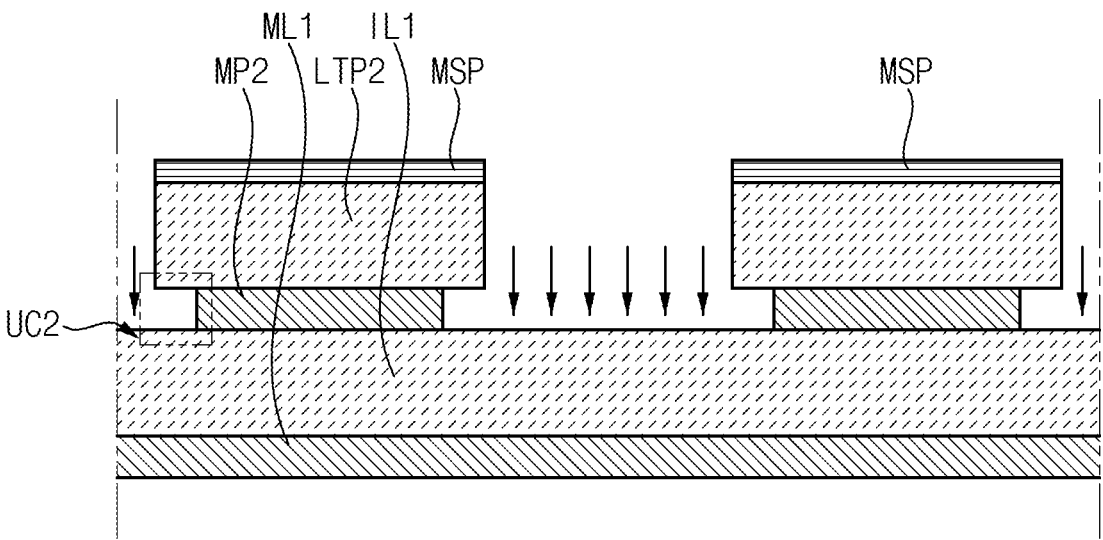

Referring further to FIG. 8, the second metal pattern MP2 may be formed by removing a portion of the second metal layer ML2 exposed from the second light transmission pattern LTP2 through the second etching process. That is, the portion of the second metal layer ML2 which does not overlap the second light transmission pattern LTP2 may be removed. In this case, a portion of the second metal layer ML2 overlapping a portion of the second light transmission pattern LTP2 may also be removed together. Accordingly, the second light transmission pattern LTP2 may have an undercut shape with respect to both ends of the second metal pattern MP2. That is, the second metal pattern MP2 and the second light transmission pattern LTP2 may define the pair of second undercut shapes UC2. In this case, as described above, in an embodiment, the second light transmission pattern LPT2 may not be etched while the second metal layer ML2 is etched. Also, in an embodiment, while the second metal layer ML2 is etched, the first insulating layer IL1 may not be etched either.

Figure 9:
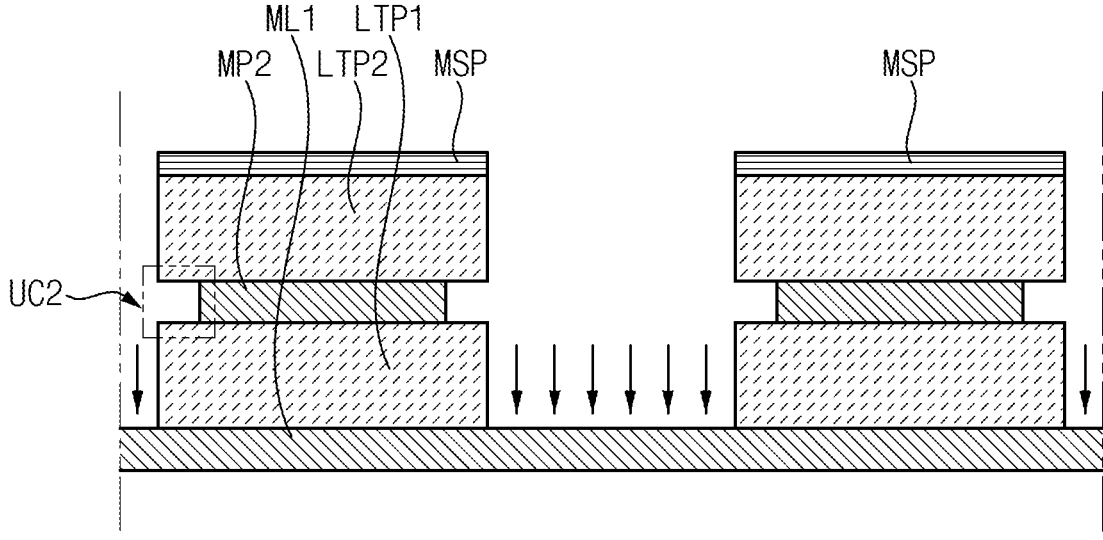

Referring further to FIG. 9, the first light transmission pattern LTP1 may be formed by removing a portion of the first insulating layer IL1 through the first etching process using the mask pattern MSP as a mask. That is, the portion of the first insulating layer IL1 which does not overlap the mask pattern MSP may be removed, and a portion overlapping the mask pattern MSP may remain to form the first light transmission pattern LTP1. As described above, in an embodiment, while the first insulating layer IL1 is etched, the first metal layer ML1 may not be etched. Also, in an embodiment, while the first insulating layer IL1 is etched, the second metal pattern MP2 may not be etched either.

Figure 10:
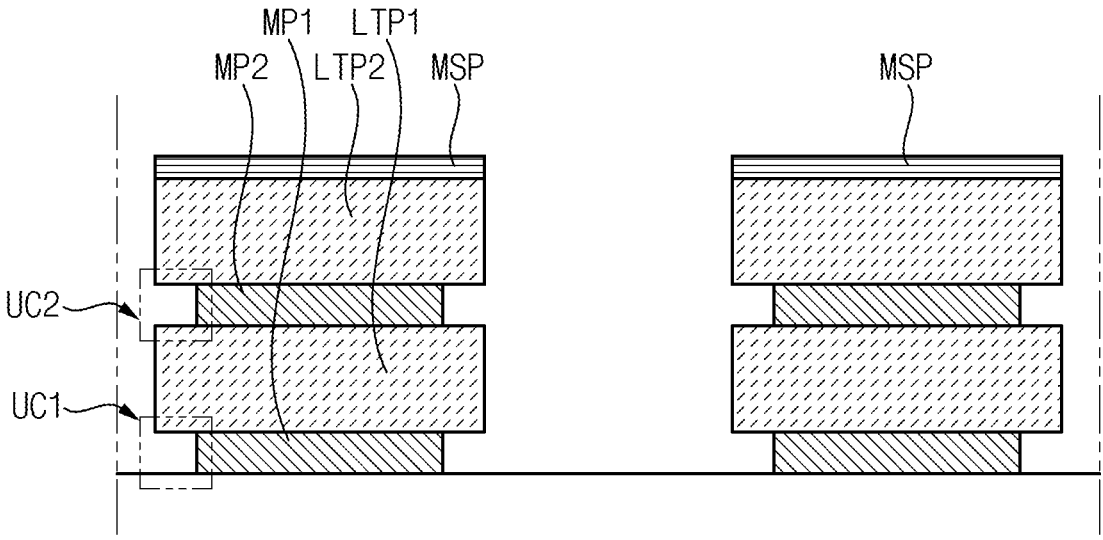

Referring further to FIG. 10, the first metal pattern MP1 may be formed by removing a portion of the first metal layer ML1 exposed from the first light transmission pattern LTP1 through the second etching process. That is, the portion of the first metal layer ML1 that does not overlap the first light transmission pattern LTP1 may be removed. In this case, a portion of the first metal layer ML1 overlapping a portion of the first light transmission pattern LTP1 may also be removed together. Accordingly, the first light transmission pattern LTP1 may have an undercut shape with respect to both ends of the first metal pattern MP1. That is, the first metal pattern MP1 and the first light transmission pattern LTP1 may define the pair of first undercut shapes UC1. At this time, as described above, in an embodiment, while the first metal layer ML1 is etched, the first light transmission pattern LPT1 may not be etched.

Figure 11:
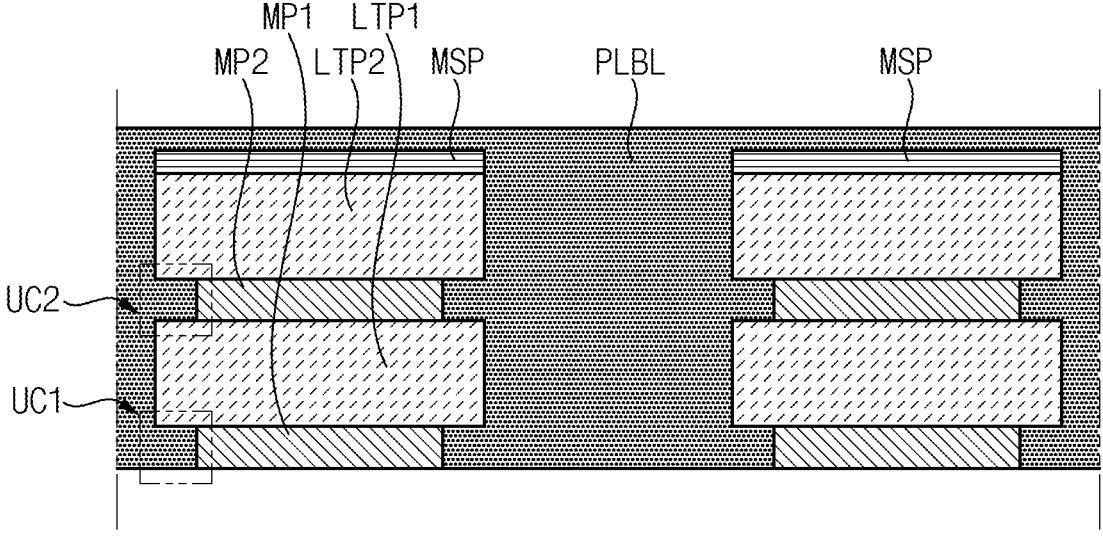

Referring to FIG. 11, a preliminary light blocking layer PLBL covering the first metal pattern MP1, the first light transmission pattern LTP1, the second metal pattern MP2, and the second light transmission pattern LTP2 may be formed. In this case, a portion of the preliminary light blocking layer PLBL may be located within the first undercut shape UC1 defined by the first metal pattern MP1 and the first light transmission pattern LTP1 and the second undercut shape UC2 defined by the second metal pattern MP2 and the transmission pattern LTP2. In an embodiment, the preliminary light blocking layer PLBL may be formed of a material which includes at least one of molybdenum (Mo), aluminum (Al), titanium (Ti), tungsten (W), silver (Ag), copper (Cu), gold (Au), a black pigment, a black dye, and a molybdenum-tantalum oxide.

Figure 12:
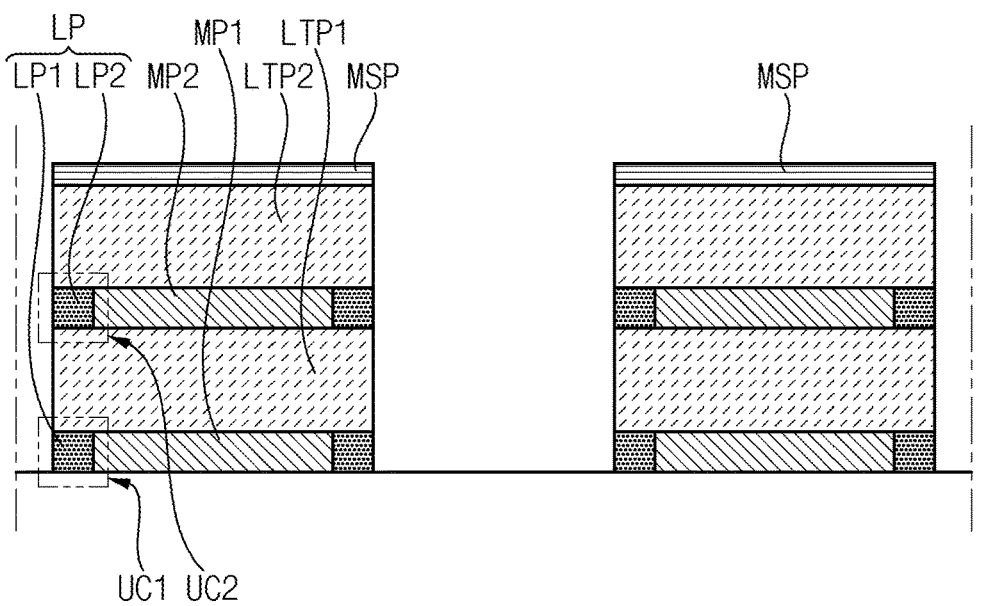

Referring to FIG. 12, the first light blocking pattern LP1 and the second light blocking pattern LP2 may be formed by removing a portion of the preliminary light blocking layer PLBL through an entire-surface ashing process. For example, a portion of the preliminary light blocking layer PLBL covered by the first light transmission pattern LTP1 may remain to form the first light blocking pattern LP1 and a portion of the preliminary light blocking layer PLBL covered by the second light transmission pattern LTP2 may remain to form the second light blocking pattern LP2, and the other portions may be removed. That is, the first light blocking pattern LP1 may be disposed on the same layer as the first metal pattern MP1. Also, the first light blocking pattern LP1 may overlap the first light transmission pattern LTP1 in a plan view. The second light blocking pattern LP2 may be disposed on the same layer as the second metal pattern MP2. Also, the second light blocking pattern LP2 may overlap the second light transmission pattern LTP2 in a plan view.

In other words, the first light blocking pattern LP1 may be disposed within the first undercut shape UC1 defined by the first metal pattern MP1 and the first light transmission pattern LTP1, and the second light blocking pattern LP2 may be disposed within the second undercut shape UC2 defined by the second metal pattern MP2 and the second light transmission pattern LTP2.

Accordingly, the light control pattern LCP including the first metal pattern MP1, the first light transmission pattern LTP1, the second metal pattern MP2, the second light transmission pattern LTP2, the first light blocking pattern LP1, and the second light blocking pattern LP2 may be formed. According to embodiments, the plurality of light control patterns LCP may be formed, and the plurality of light control patterns LCP may have the same structure each other.

Figure 13:
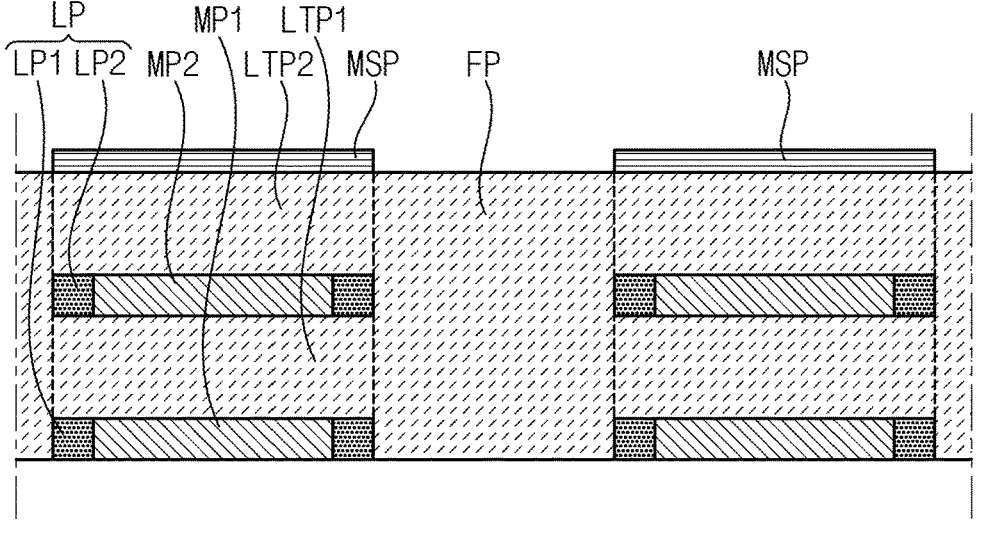

Referring to FIG. 13, after the light control patterns LCP are formed, the filling pattern FP may be formed between the light control patterns LCP adjacent to each other. In an embodiment, the filling pattern FP may be formed of phenolic resin, polyacrylates resin, polyimides rein, polyamides resin, siloxane resin, and epoxy resin, or the like. In an embodiment, the height of the upper surface of the filling pattern FP may be substantially the same as the height of the upper surface of the light control pattern LCP.

Figure 14:
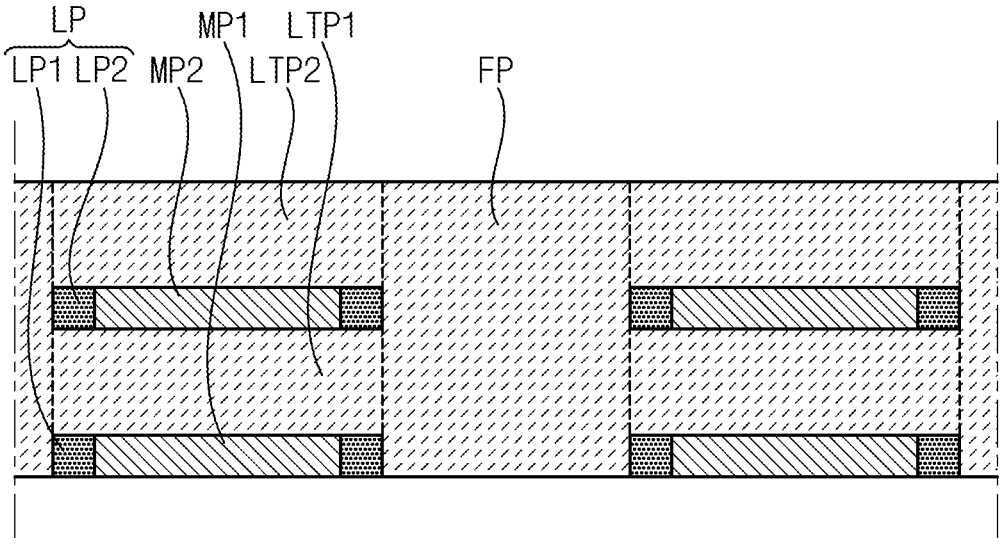

Referring to FIG. 14, the mask pattern MSP may be removed. Optionally, the mask pattern MSP may not be removed. In this case, the mask pattern MSP may be formed using a transparent conductive material (TCO).

Meanwhile, FIGS. 5 to 14 illustrate that the first etching process and the second etching process are performed twice respectively for the preliminary light control layer including two metal layers and two insulating layers to form the light control patterns LCP, and accordingly the light blocking patterns of the light control film LCF are formed to have a two-level structure. However, the present invention is not necessarily limited thereto. In an alternative embodiment, the first etching process may be performed three or more times, and the second etching process may be performed three or more times for the preliminary light control layer including three or more metal layers and three or more insulating layers to form the light control patterns LCP, and accordingly, the light blocking patterns of the light control film LCF may be formed to have a multi-level structure of three or more levels.

FIGS. 15 to 20 are views illustrating display devices according to embodiments.

Figure 18:
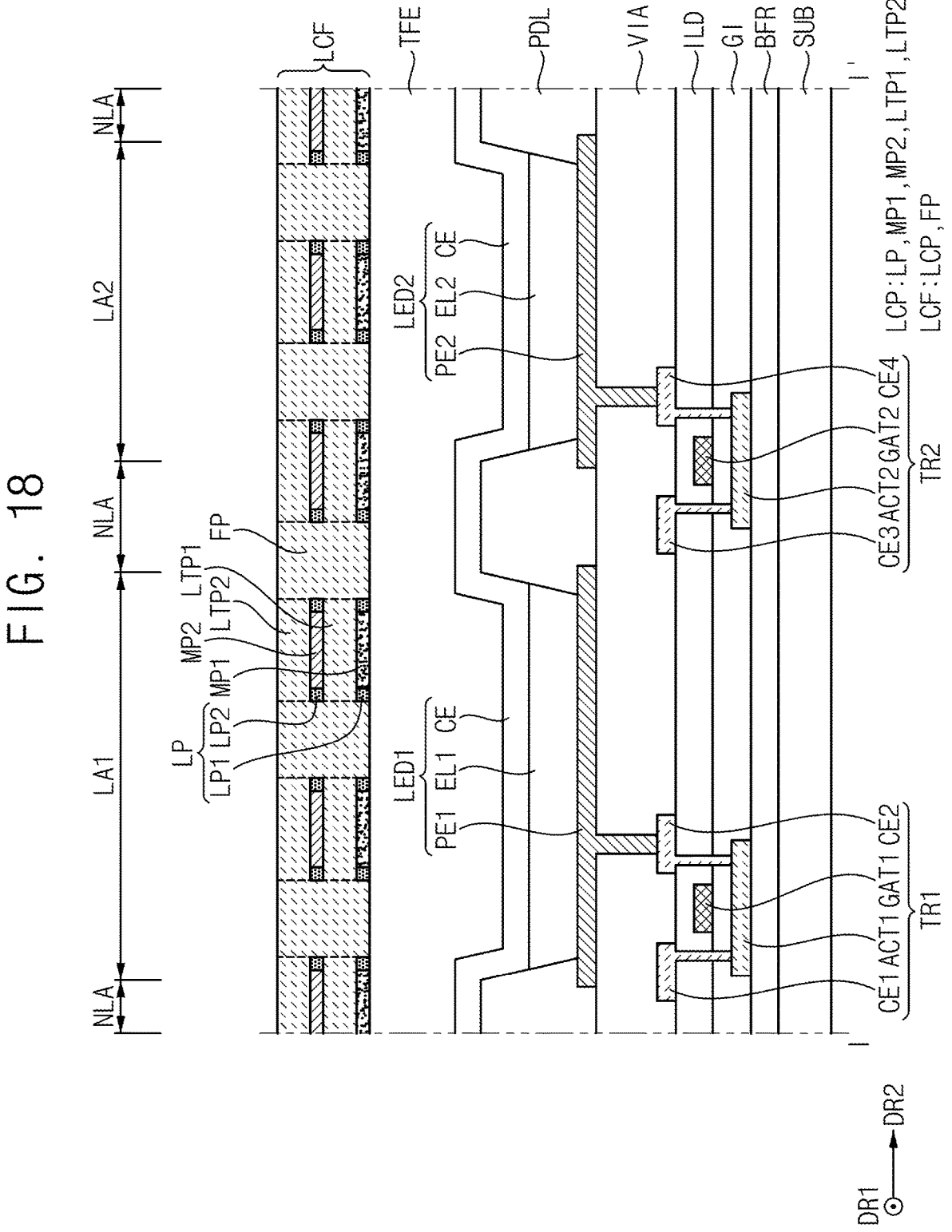
Figure 19:
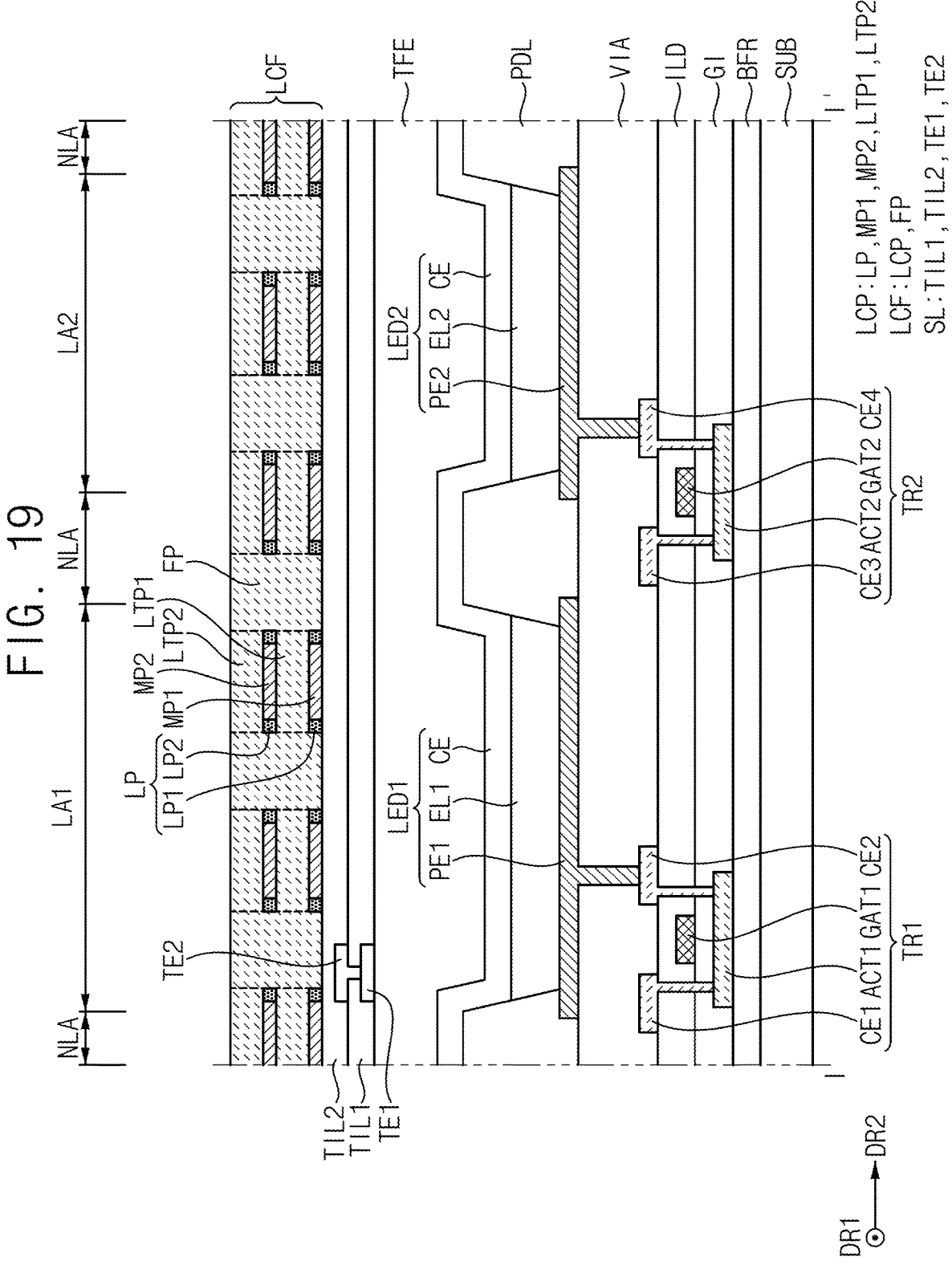
Figure 20:
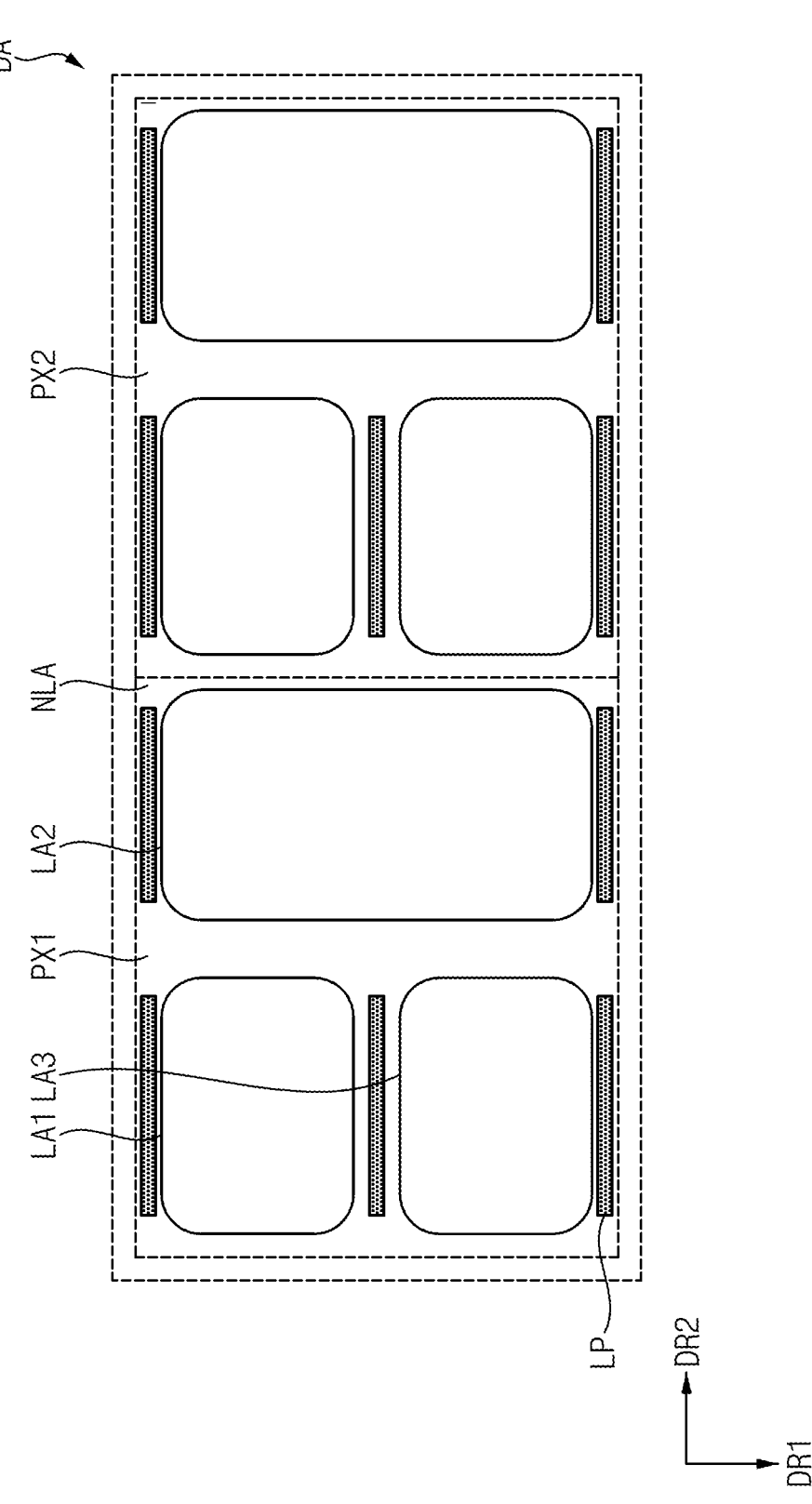

Each of FIGS. 15 to 19 may correspond to the cross-sectional view of FIG. 3, and FIG. 20 may correspond to the plan view of FIG. 2. Hereinafter, differences from the display device DD described with reference to FIGS. 1 to 4 will be mainly described, and repeated descriptions will be omitted or simplified.

Figure 15:
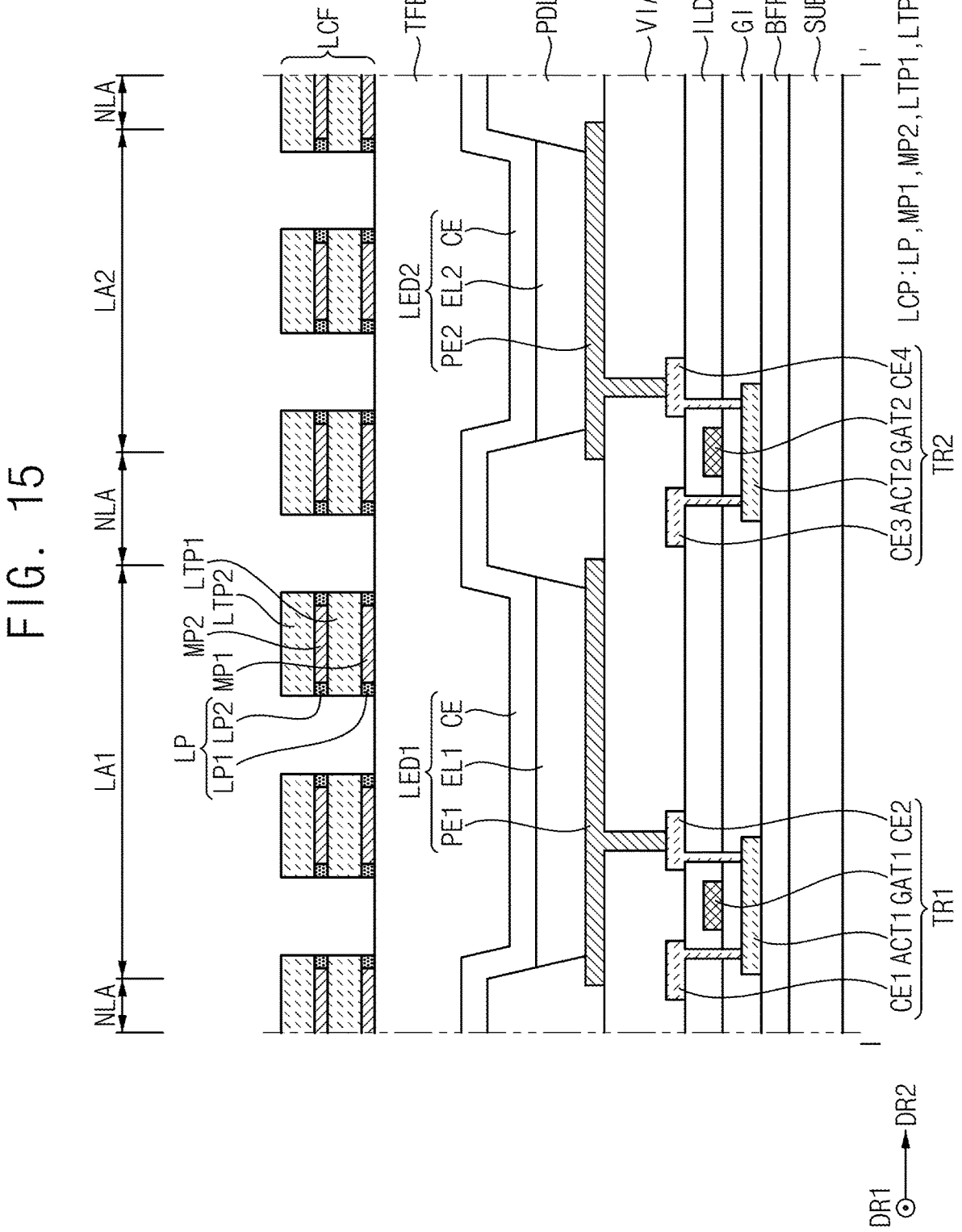

Referring to FIG. 15, in an embodiment, the filling pattern FP may be omitted. In this case, the light control film LCF may be a set of the plurality of light control patterns LCP. When the filling pattern FP is omitted, transmittance of light incident through the light control film LCF may be further improved.

Figure 16:
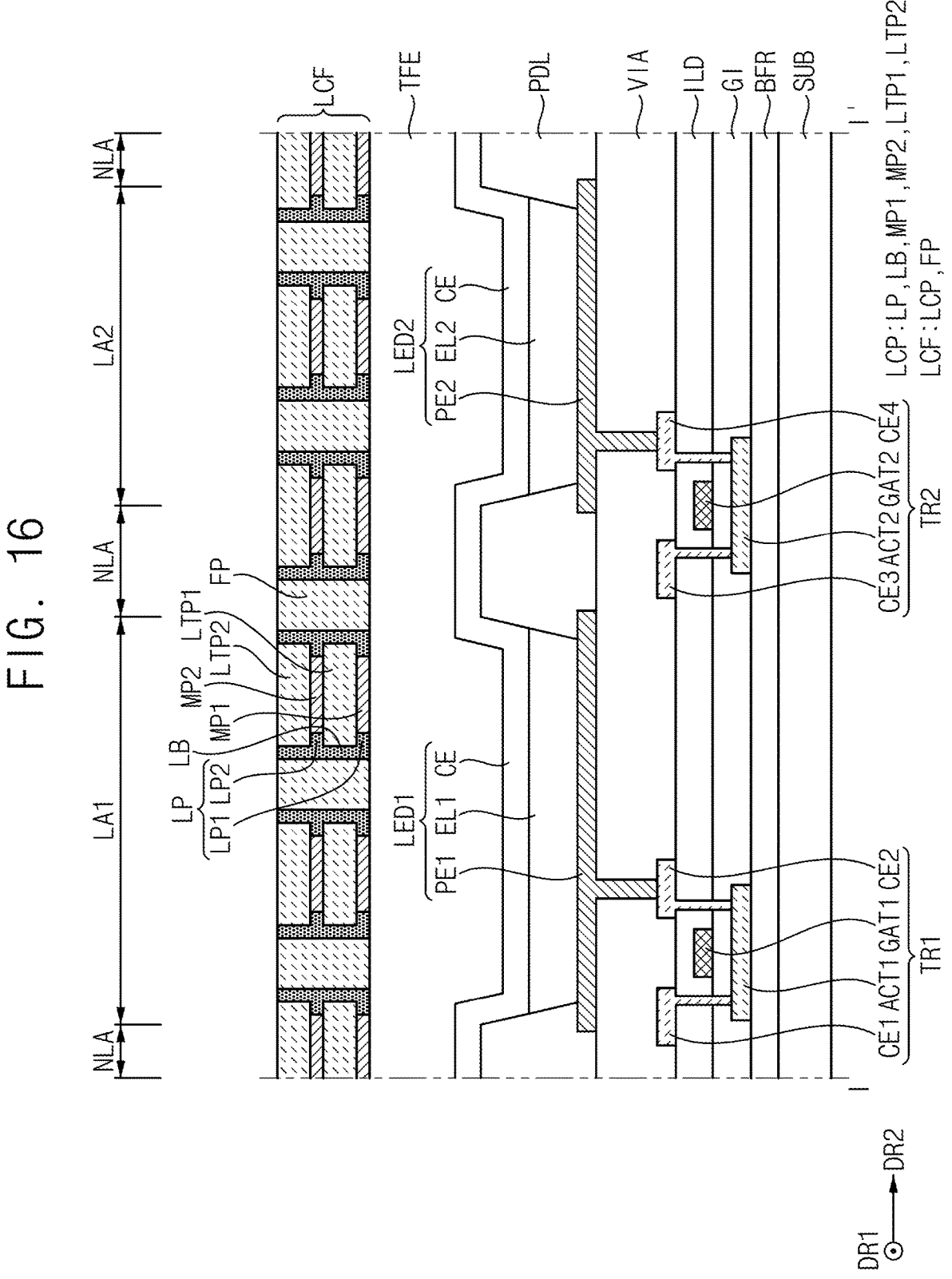

Referring to FIG. 16, in an embodiment, each of the light control patterns LCP may further include a light blocking partition LB. For example, each of the light control patterns LCP may further include a pair of light blocking partitions LB. The light blocking partition LB may cover a side surface of the first light blocking pattern LP1, a side surface of the first light transmitting pattern LTP1, a side surface of the second light blocking pattern LP2, and a side surface of the second light transmitting pattern LTP2.

In an embodiment, the light blocking partition LB may include molybdenum (Mo), aluminum (Al), titanium (Ti), tungsten (W), silver (Ag), copper (Cu), gold (Au), a black pigment, a black dye, and a molybdenum-tantalum oxide, or the like. Among the lights emitted from the first light emitting device LED1 and the second light emitting device LED2, light incident on the light blocking partition LB may be reflected from the light blocking partition LB, may be transmitted through the light blocking partition LB, or may be absorbed by light blocking partition LB. In an embodiment, most of the light incident on the light blocking partition LB may be absorbed by the light blocking partition LB. Accordingly, the light blocking partition LB may control the viewing angle of the display device DD.

In an embodiment, the light blocking partition LB may be formed through the same process as the first light blocking pattern LP1 and the second light blocking pattern LP2. In other words, the light blocking partition LB may include the same material as the first light blocking pattern LP1 and the second light blocking pattern LP2. In an embodiment, the light blocking partition LB may be integrally formed with the first light blocking pattern LP1 and the second light blocking pattern LP2. In an alternative embodiment, the light blocking pattern LB may be formed by a separate process different from the first light blocking pattern LP1 and the second light blocking pattern LP2.

According to the embodiments, as the light control pattern LCP further includes the light blocking partition LB, the viewing angle of the display device DD may be more effectively controlled.

Figure 17:
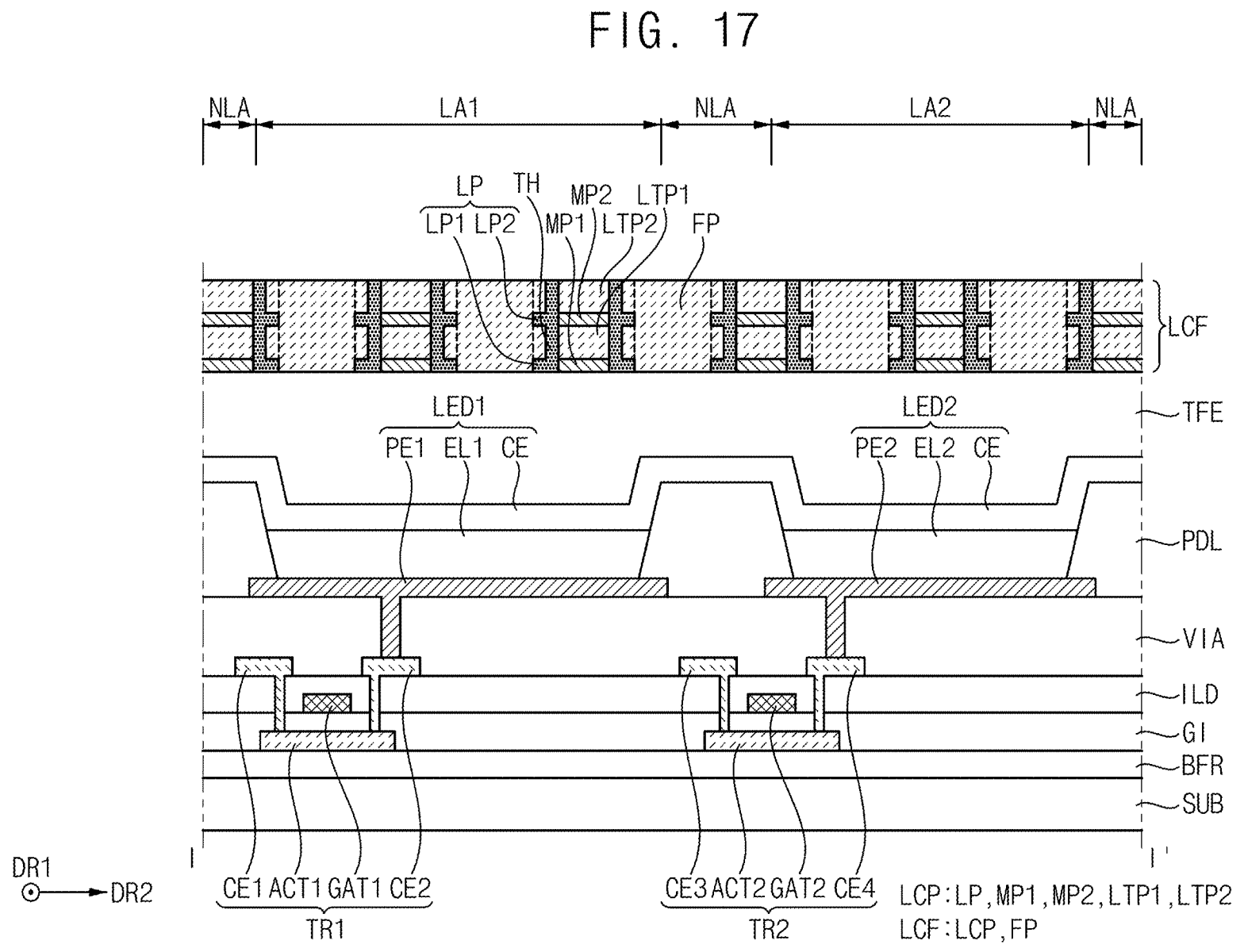

Referring to FIG. 17, in an embodiment, each of the light control patterns LCP may have at least one through hole TH penetrating the corresponding light control pattern LCP. In an embodiment, the through hole TH may be spatially connected to the first undercut shape UC1 defined by the first metal pattern MP1 and the first light transmission pattern LTP1 and the second undercut shape UC2 defined by the second metal pattern MP2 the second transmission pattern LTP2.

In an embodiment, the through hole TH may be filled with the same material as the first light blocking pattern LP1 and the second light blocking pattern LP2. For example, the through hole TH may be filled with a material including at least one of molybdenum (Mo), aluminum (Al), titanium (Ti), tungsten (W), silver (Ag), copper (Cu), gold (Au), a black pigment, a black dye, and a molybdenum-tantalum oxide.

According to embodiments, as the through hole TH is defined in the light control pattern LCP, a generation of air bubbles may be reduced or prevented during a formation of the first and second light blocking patterns LP1 and LP2. Accordingly, after the first and second light blocking patterns LP1 and LP2 are formed, an occurrence of empty spaces may be reduced or prevented. Accordingly, the viewing angle of the display device DD may be more effectively controlled.

Referring to FIG. 18, in an embodiment, the first metal pattern MP1 and the second metal pattern MP2 may include different materials.

In an embodiment, an etching rate of the second metal pattern MP2 in the second etching process (e.g., a wet process using an etchant) may be lower than an etching rate of the first metal pattern MP1 in the second etching process.

That is, according to the second etching process, the first metal layer (e.g., ML1 in FIG. 5) may be etched relatively more than the second metal layer (e.g., ML2 in FIG. 5). For example, according to the second etching process, only the first metal layer ML1 may be etched, and the second metal layer ML2 may not be etched.

In one embodiment, the first metal pattern MP1 may include indium zinc oxide (IZO), and the second metal pattern MP2 may include indium tin oxide (ITO).

According to embodiments, since the first metal pattern MP1 and the second metal pattern MP2 include materials having different etching rates, wear of the upper metal pattern is reduced or prevented even when the etching process is repeated. Accordingly, both ends of the first metal pattern MP1 and both ends of the second metal pattern MP2 may be substantially aligned on the same line.

Referring to FIG. 19, in one embodiment, the display device DD may further include a sensing layer SL. The sensing layer SL may be disposed on the encapsulation layer TFE. In this case, the light control film LCF may be disposed on the sensing layer SL.

In an embodiment, the sensing layer SL may include the first touch electrode TE1, a first touch insulating layer TIL1 disposed on the first touch electrode TE1, a second touch electrode TE2 disposed on the first touch insulating layer TIL1 a second touch insulating layer TIL2 disposed on the second touch electrode TE2. The second touch insulating layer TIL2 may have a substantially flat upper surface. The second touch electrode TE2 may be connected to the first touch electrode TE1 through a contact hole penetrating the first touch insulating layer TIL1. The sensing layer SL may function as an input means of the display device.

Referring to FIG. 20, in an embodiment, each of the light blocking patterns LP may overlap the non-light emitting area NLA. However, each of the light blocking patterns LP may not overlap the first light emitting area LA1, the second light emitting area LA2, and the third light emitting area LA3. When each of the light blocking patterns LP does not overlap the first light emitting area LA1, the second light emitting area LA2, and the third light emitting area LA3, transmittance of the display device DD may be further improved.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
a substrate;
a light emitting device disposed on the substrate;
an encapsulation layer covering the light emitting device; and
a light control film disposed on the encapsulation layer and including a plurality of light control patterns, and
wherein each of the light control patterns includes:
  a first metal pattern disposed on the encapsulation layer;
  a first light transmission pattern disposed on the first metal pattern;
  a second metal pattern disposed on the first light transmission pattern and overlapping the first metal pattern;
  a second light transmission pattern disposed on the second metal pattern and overlapping the first light transmission pattern;
  a first light blocking pattern disposed on a same layer as the first metal pattern and overlapping the first light transmission pattern; and
  a second light blocking pattern disposed on a same layer as the second metal pattern and overlapping the second light transmission pattern.

2. The display device of claim 1, wherein the first light blocking pattern is disposed within a first undercut shape defined by the first metal pattern and the first light transmission pattern, and wherein the second light blocking pattern is disposed within a second undercut shape defined by the second metal pattern and the second light transmission pattern.

3. The display device of claim 1, wherein a refractive index of the first light transmission pattern for light in a wavelength range of about 380 nm to about 780 nm is about 1 to about 2, and
wherein a refractive index of the second light transmission pattern for light in a wavelength range of about 380 nm to about 780 nm is about 1 to about 2.

4. The display device of claim 1, wherein a distance between the light control patterns adjacent to each other is about 5 micrometers to about 10 micrometers.

5. The display device of claim 1, wherein a height of each of the light control patterns is about 10 micrometers to about 30 micrometers.

6. The display device of claim 1, wherein a width of the first light blocking pattern and a width of the second light blocking pattern are about 1 micrometers to 2 micrometers.

7. The display device of claim 1, wherein an etching rate of the second metal pattern is lower than an etching rate of the first metal pattern in the same etching process.

8. The display device of claim 1, wherein the first metal pattern and the second metal pattern include a transparent conductive oxide.

9. The display device of claim 1, wherein the first light transmission pattern and the second light transmission pattern include a transparent organic material.

10. The display device of claim 1, wherein the first light blocking pattern and the second light blocking pattern overlap each other in a plan view.

11. The display device of claim 1, wherein the light control film further include at least one filling pattern disposed between light control patterns adjacent to each other and including a transparent organic material.

12. The display device of claim 1, wherein at least one of the light control patterns has a through hole penetrating a corresponding light control pattern, and
wherein the through hole is filled with the same material as the first light blocking pattern and the second light blocking pattern.

13. The display device of claim 1, wherein each of the light control patterns further includes a light blocking partition covering a side surface of the first light transmission pattern, a side surface of the second light transmission pattern, a side surface of the first light blocking pattern, and a side surface of the second light blocking pattern.

14. The display device of claim 13, wherein the light blocking partition is integrally formed with the first light blocking pattern and the second light blocking pattern.

* * * * *